US012604724B2

(12) United States Patent
Kim et al.

(10) Patent No.: US 12,604,724 B2
(45) Date of Patent: Apr. 14, 2026

(54) VERTICAL SEMICONDUCTOR DEVICE

(71) Applicant: SAMSUNG ELECTRONICS CO., LTD., Suwon-si (KR)

(72) Inventors: Jaeho Kim, Suwon-si (KR); Woosung Yang, Suwon-si (KR); Jimo Gu, Suwon-si (KR); Sukkang Sung, Suwon-si (KR); Ahreum Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 323 days.

(21) Appl. No.: 18/312,880

(22) Filed: May 5, 2023

(65) Prior Publication Data

US 2024/0014132 A1     Jan. 11, 2024

(30) Foreign Application Priority Data

Jul. 6, 2022     (KR) ........................ 10-2022-0082962

(51) Int. Cl.
H01L 23/528         (2006.01)
H01L 23/522         (2006.01)
(Continued)

(52) U.S. Cl.
CPC ...... H01L 23/5283 (2013.01); H01L 23/5226 (2013.01); H01L 25/0652 (2013.01);
(Continued)

(58) Field of Classification Search
CPC ........ H10B 41/35; H10B 43/35; H10B 43/50; H10B 41/30; H10B 41/50; H10B 43/30;
(Continued)

(56) References Cited

U.S. PATENT DOCUMENTS 10,354,987 B1     7/2019   Mushiga et al.
10,930,661 B2     2/2021   Chen et al.
(Continued)

FOREIGN PATENT DOCUMENTS

CN      201880001682      8/2018
KR      10-2020-0073455 A    6/2020
(Continued)

OTHER PUBLICATIONS

Notice of Allowance dated Feb. 12, 2026 issued in corresponding to Korean Patent Application No. 10-2022-0082962.

*Primary Examiner* — Julio J Maldonado
*Assistant Examiner* — Paul A Berry
(74) *Attorney, Agent, or Firm* — Morgan, Lewis & Bockius LLP

(57)         ABSTRACT

A vertical semiconductor device includes lower circuit patterns disposed on a first substrate. A bonding layer is disposed on the lower circuit patterns. A wire is disposed on the bonding layer. A cell stack structure is disposed on the wire. A base pattern is disposed on the cell stack structure. An upper insulating layer is disposed on the base pattern. A cell contact plug passes through the cell stack structure and extends to the upper insulating layer. A through-plug is disposed inside a through-hole formed through an outer side of the base pattern to extend to the upper insulating layer. Each of the cell contact plug and the through-plug includes a barrier metal pattern and a metal pattern, and the barrier metal pattern is disposed along sidewalls and bottom surfaces of the cell contact hole and the through-hole.

20 Claims, 33 Drawing Sheets

(51) Int. Cl.

| | |
|---|---|
| *H01L 25/065* | (2023.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |
| *H10B 80/00* | (2023.01) |

(52) U.S. Cl.
CPC ............. *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10B 80/00* (2023.02)

(58) Field of Classification Search
CPC ........ H10B 41/27; H10B 43/27; H10B 41/10; H10B 43/10; H10B 43/20; H10B 80/00; H10B 41/42; H01L 23/5226; H01L 23/5283; H01L 25/0652; H01L 25/18
See application file for complete search history.

(56) References Cited

U.S. PATENT DOCUMENTS

| | | | | |
|---|---|---|---|---|
| 2020/0194456 A1* | 6/2020 | Baek | ...................... | H10B 41/50 |
| 2021/0036015 A1* | 2/2021 | Lim | ...................... | H10B 43/27 |
| 2021/0134824 A1 | 5/2021 | Chen et al. | | |
| 2021/0265377 A1 | 8/2021 | Chen et al. | | |
| 2021/0391289 A1 | 12/2021 | Kim et al. | | |
| 2022/0005825 A1* | 1/2022 | Zhang | ................... | H10B 43/27 |
| 2022/0013638 A1 | 1/2022 | Lee et al. | | |
| 2022/0037352 A1 | 2/2022 | Zhang et al. | | |
| 2022/0052069 A1 | 2/2022 | Kim et al. | | |
| 2022/0068883 A1 | 3/2022 | Xiao et al. | | |
| 2022/0093637 A1 | 3/2022 | Lee | | |

FOREIGN PATENT DOCUMENTS

| | | | |
|---|---|---|---|
| KR | 10-2022-0048747 A | 4/2022 |
| KR | 10-2022-0053733 A | 5/2022 |

* cited by examiner

I'

260

258

C

B 256
256

254

A 250          252

SECOND
DIRECTION

FIRST
DIRECTION

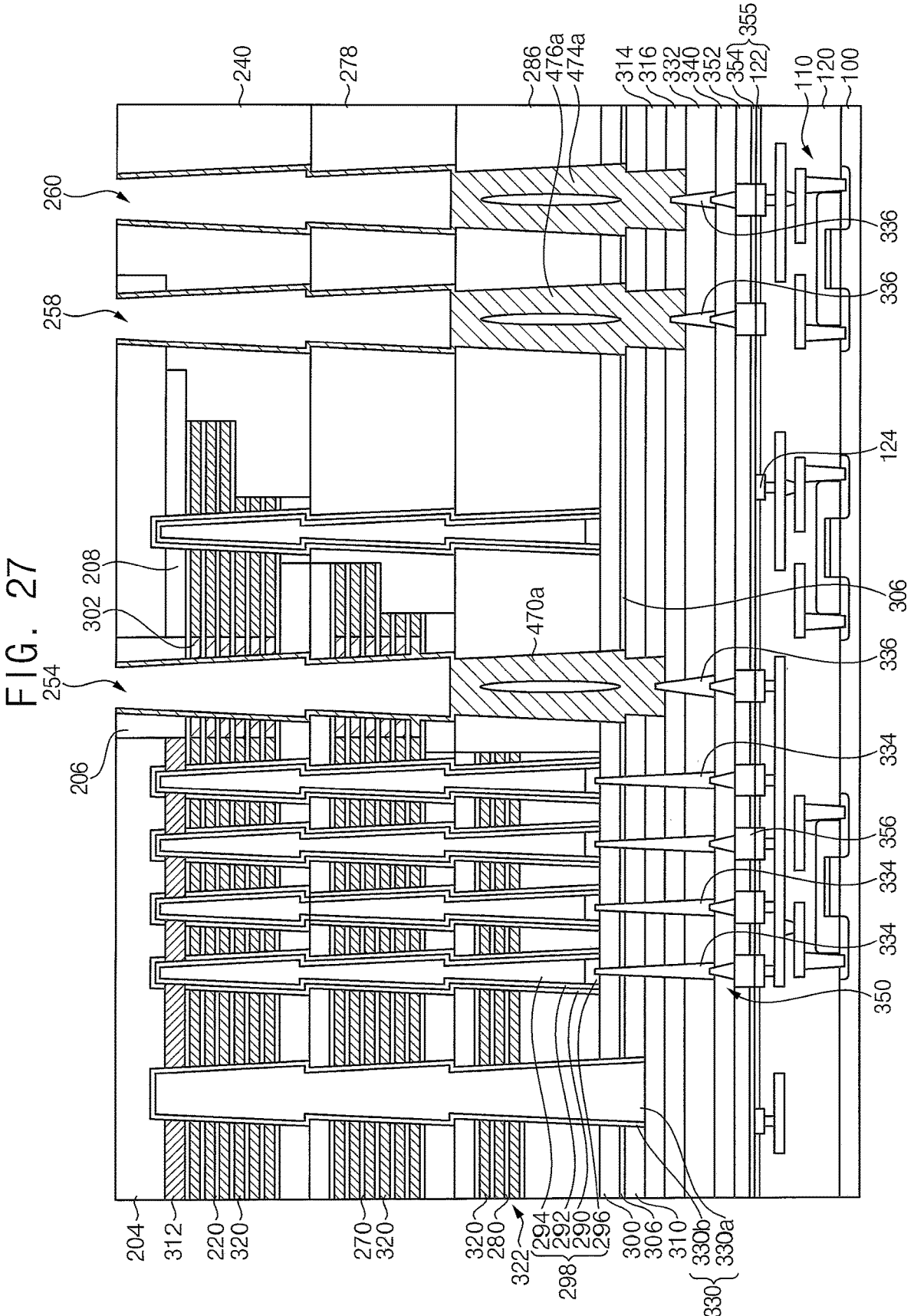
F I G. 27

VERTICAL SEMICONDUCTOR DEVICE

CROSS-REFERENCE TO RELATED APPLICATION

This application claims priority under 35 USC § 119 to Korean Patent Application No. 10-2022-0082962, filed on Jul. 6, 2022 in the Korean Intellectual Property Office (KIPO), the entire disclosure of which is herein incorporated by reference.

TECHNICAL FIELD

The present disclosure relate to a semiconductor device. More particularly, the present disclosure relate to a vertical semiconductor device.

DISCUSSION OF THE RELATED ART

A bonding-type vertical semiconductor device may be formed by bonding a first substrate, on which peripheral circuits are formed, and a second substrate, on which memory cells stacked in a vertical direction are formed, to each other. The bonding-type vertical semiconductor device may be configured such that as a stacked height of the memory cells increases, a vertical height of wires also increases. This may make the formation of wires more difficult.

SUMMARY

A vertical semiconductor device includes a first substrate on which lower circuit patterns are formed. A bonding layer is disposed on the lower circuit patterns. A wire is disposed on the bonding layer. Pattern structures including an insulating pattern and a gate electrode, which are alternately stacked on a top surface of the first substrate in a vertical direction, having an edge region having a step shape in which a length gradually increases from a bottom to a top, and extending in a first direction that is parallel to the top surface of the first substrate are disposed on the wire. An embedded insulating pattern extending in the first direction is disposed inside a trench between the pattern structures. A base pattern is disposed on the pattern structure. An upper insulating layer is disposed on the base pattern. A channel structure extending to the base pattern is disposed inside a channel hole formed through the pattern structure. A cell contact plug extending to the upper insulating layer and electrically connected to one gate electrode in the pattern structure is disposed inside a cell contact hole formed through a step-shaped region of the pattern structure. A through-plug is disposed inside a through-hole formed through an outer side of the base pattern and extends to the upper insulating layer. Each of bottom surfaces of the cell contact plug and the through-plug is disposed at a level higher than a bottom surface of the embedded insulating pattern.

A vertical semiconductor device includes a first substrate on which lower circuit patterns are formed. A bonding layer is disposed on the lower circuit patterns. A wire is disposed on the bonding layer. Pattern structures including an insulating pattern and a gate electrode, which are alternately stacked on a top surface of the first substrate in a vertical direction, having an edge region having a step shape in which a length gradually increases from a bottom to a top, and extending in a first direction that is parallel to the top surface of the first substrate are disposed on the wire. A base pattern is disposed on the pattern structure. An upper insulating layer is disposed on the base pattern. A channel structure extending to the base pattern is disposed inside a channel hole formed through the pattern structure. A cell contact plug extending to the upper insulating layer and electrically connected to one gate electrode in the pattern structure is disposed inside a cell contact hole formed through a step-shaped region of the pattern structure. A through-plug is disposed inside a through-hole formed through an outer side of the base pattern to extend to the upper insulating layer. A plate contact plug electrically connected to the base pattern is disposed inside a plate contact hole formed through an outer side of the pattern structure. Bottom surfaces of the cell contact plug, the through-plug, and the plate contact plug are disposed on a same plane.

A vertical semiconductor device includes a first substrate on which lower circuit patterns are formed. A bonding layer is disposed on the lower circuit patterns. A wire is disposed on the bonding layer. A cell stack structure is disposed on the wire. A base pattern is disposed on the cell stack structure. An upper insulating layer is disposed on the base pattern. A cell contact plug passes through the cell stack structure and extends to the upper insulating layer. A through-plug is disposed inside a through-hole formed through an outer side of the base pattern and extends to the upper insulating layer. Each of the cell contact plug and the through-plug includes a barrier metal pattern and a metal pattern, and the barrier metal pattern is disposed along sidewalls and bottom surfaces of the cell contact hole and the through-hole.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 4 to 21 are cross-sectional views and a plan view illustrating a method of manufacturing a vertical semiconductor device according to exemplary embodiments.

FIGS. 26 to 28 are cross-sectional views illustrating a method of manufacturing a vertical semiconductor device according to exemplary embodiments.

DETAILED DESCRIPTION OF THE EMBODIMENTS

Hereinafter, exemplary embodiments of the present disclosure will be described in detail with reference to the accompanying drawings.

In the following description, a direction that is parallel to a substrate surface will be defined as a first direction, and a direction that is parallel to the substrate surface and perpendicular to the first direction will be defined as a second direction. In addition, a direction that is perpendicular to the substrate surface will be defined as a vertical direction.

Figure 1:
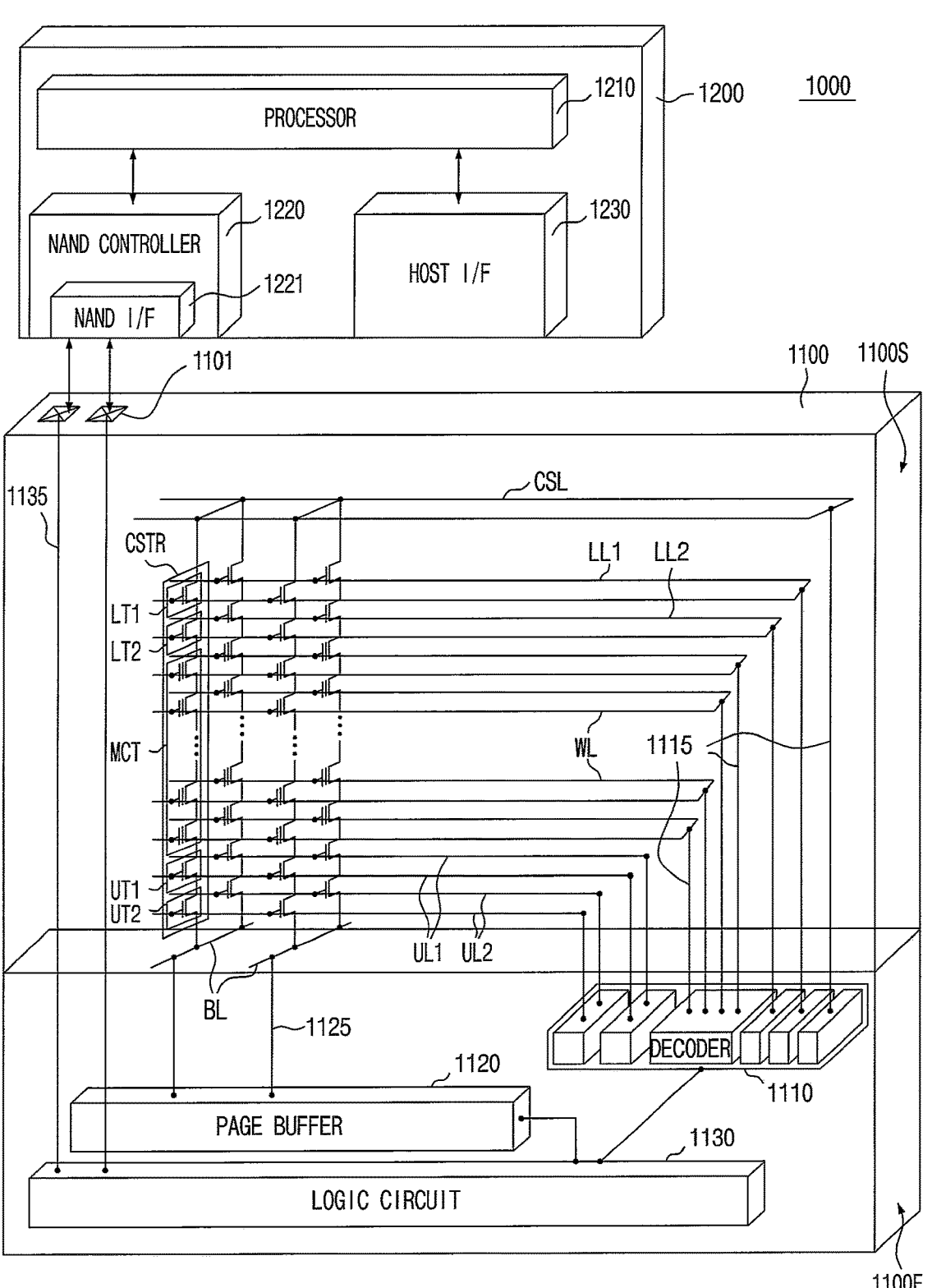
FIG. 1 is a schematic diagram illustrating an electronic system including a semiconductor device according to exemplary embodiments.

FIG. 1 is a schematic diagram illustrating an electronic system including a semiconductor device according to exemplary embodiments.

Referring to FIG. 1, an electronic system 1000, in accordance with example embodiments, may include a semiconductor device 1100 and a controller 1200 electrically connected to the semiconductor device 1100. The electronic system 1000 may be a storage device including one or more semiconductor devices 1100 or an electronic device including the storage device. For example, the electronic system 1000 may be a solid state drive device (SSD), a universal serial bus (USB), a computing system, a medical device, or a communication device, which are include one or more semiconductor devices 1100.

The semiconductor device 1100 may be a non-volatile memory device. For example, the semiconductor device 1100 may be one of vertical semiconductor devices illustrated with reference to FIGS. 21, 28, 29, 32 and 33.

The semiconductor device 1100 may include a first structure 1100F and a second structure 1100S disposed on the first structure 1100F. The first structure 1100F may be a peripheral circuit structure including a decoder circuit 1110, a page buffer 1120, and a logic circuit 1130. The second structure 1100S may include a bit line BL, a common source line CSL, a word lines WL, first and second gate upper lines UL1 and UL2, and first and second gate lower lines LL1 and LL2, and memory cell strings CSTR between the bit line BL and the common source line CSL. The second structure 1100S may serve as a memory cell structure.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be variously modified in accordance with embodiments.

In example embodiments, the upper transistors UT1 and UT2 may include a string selection transistor, and the lower transistors LT1 and LT2 may include a ground selection transistor. Gate lower lines LL1 and LL2 may be gate electrodes of lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used to erase data stored in the memory cell transistors MCT, and the data may be erased by using a gate induced leakage current (GIDL).

The common source line CSL, the first and second gate lower lines LL1 and LL2, the word lines WL, and the first and second gate upper lines UL1 and UL2 may be electrically connected to the decoder circuit 1110 by a first connection wiring 1115 extending to the second structure 1100S from the first structure 110F. The bit lines BL may be electrically connected to the page buffer 1120 by a second connection wiring 1125 extending from the first structure 110F to the second structure 1100S.

In the first structure 110F, the decoder circuit 1110 and the page buffer 1120 may control at least one selected memory cell transistor among the plurality of memory cell transistors MCT. The decoder circuit 1110 and the page buffer 1120 may be controlled by the logic circuit 1130. The semiconductor device 1100 may be in communication with the controller 1200 by an input/output pad 1101 electrically connected to the logic circuit 1130. The input/output pad 1101 may be electrically connected to the logic circuit 1130 by an input/output connection wiring 1135 extending from the first structure 110F to the second structure 1100S.

The controller 1200 may include a processor 1210, a NAND controller 1220, and a host interface 1230. In example embodiments, the electronic system 1000 may include a plurality of semiconductor devices 1100. In this case, the controller 1200 may control the plurality of semiconductor devices 1100.

The processor 1210 may control an overall operation of the electronic system 1000 including the controller 1200. The processor 1210 may operate according to a firmware. The processor 1210 may control the NAND controller 1220 so that the semiconductor device 1100 may be accessed. The NAND controller 1220 may include a NAND interface 1221 for communication with the semiconductor device 1100. A control command for controlling the semiconductor device 1100, data for writing in the memory cell transistors MCT of the semiconductor device 1100, and data for reading from the memory cell transistors MCT of the semiconductor device 1100 may be transmitted by the NAND interface 1221. The host interface 1230 may be in communication with the electronic system 1000 and an external host. When the control command is received from the external host by the host interface 1230, the processor 1210 may control the semiconductor device 1100 in response to the control command.

Figure 2:
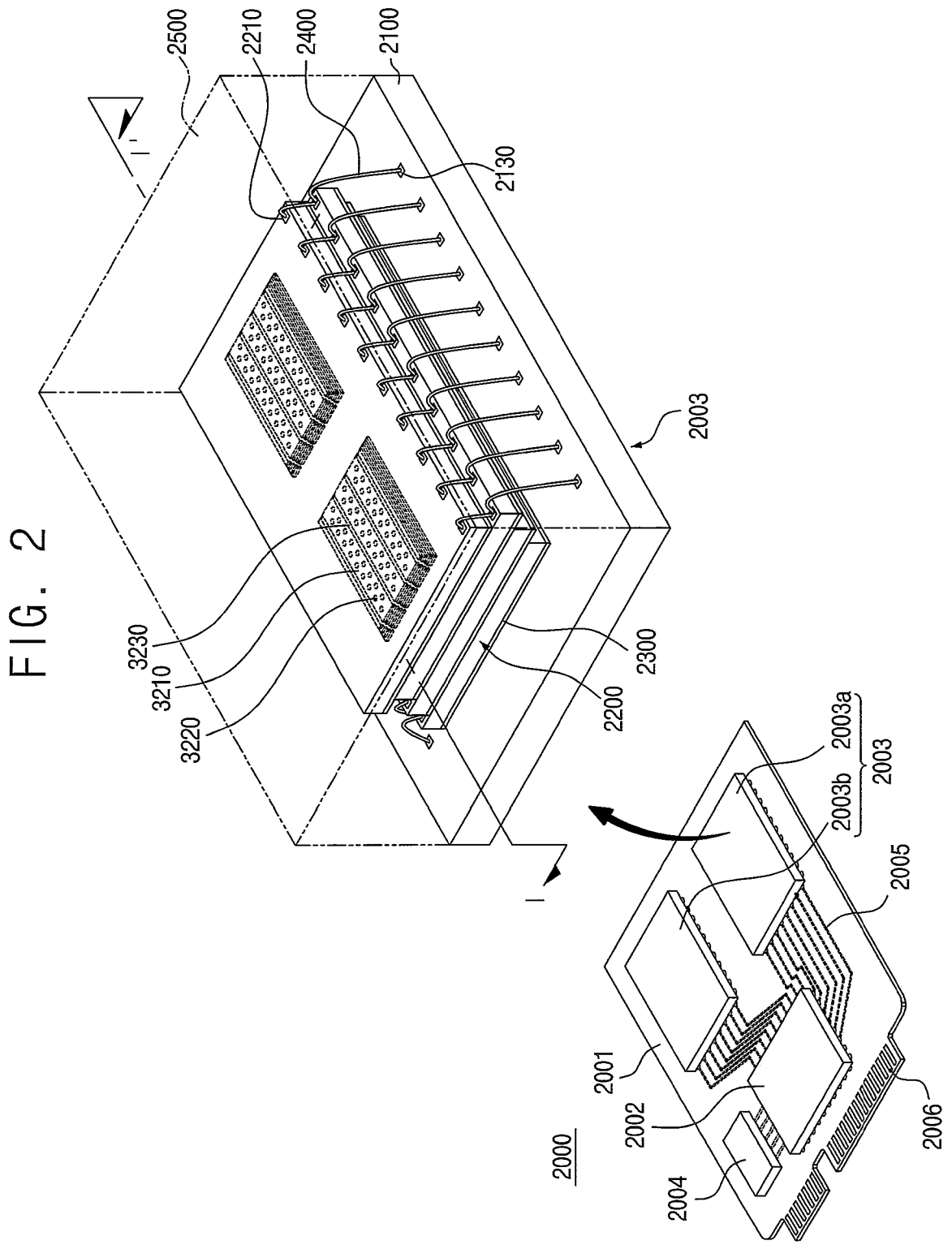
FIG. 2 is a schematic perspective view illustrating an electronic system including a semiconductor device according to an exemplary embodiment.

FIG. 2 is a schematic perspective view illustrating an electronic system including a semiconductor device according to an exemplary embodiment.

Referring to FIG. 2, an electronic system 2000, in accordance with example embodiments, may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to the external host. The number and arrangement of the plurality of pins in the connector 2006 may be controlled according to a communication interface between the electronic system 2000 and the external host. In example embodiments, the electronic system 2000 may be in communication with the external host by one of interfaces including a Universal Serial Bus (USB), a Peripheral Component Interconnect Express (PCI-Express), a Serial Advanced Technology Attachment (SATA), an M-Phy for Universal Flash Storage (UFS), etc. In example embodiments, the electronic system 2000 may be operated by power supplied from the external host through the connector 2006. The electronic system 2000 may further include a Power Management Integrated Circuit (PMIC) for distributing the power supplied from the external host to the controller 2002 and the semiconductor package 2003.

The controller 2002 may write data in the semiconductor package 2003, or the controller 2002 may read data from the semiconductor package 2003. An operation speed of the electronic system 2000 may be increased by the controller 2002.

The DRAM 2004 may be a buffer memory for reducing a difference between a speed of the semiconductor package 2003 for storing data and a speed of the external host. The DRAM 2004 included in the electronic system 2000 may also operate as a type of a cache memory, and the DRAM 2004 may provide a space for temporarily storing data in a control operation of the semiconductor package 2003. When the DRAM 2004 is included in the electronic system 2000, the controller 2002 may include a DRAM controller for controlling the DRAM 2004 and a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesion layers 2300 disposed on a lower surface of each of the semiconductor chips 2200, a connection structure 2400 electrically connected to the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include cell stacked structures 3210 and channel structures 3220. Each of the semiconductor chips 2200 may include, e.g., the vertical semiconductor device illustrated with reference to FIG. 21,28, 29, 32 or 33.

In example embodiments, the connection structure 2400 may be a bonding wire for electrically connecting with the input/output pad 2210 and the package upper pads 2130. Thus, in each of the first and second semiconductor packages 2003a and 2003b, the semiconductor chips 2200 may be electrically connected to each other by the bonding wire. The semiconductor chips 2200 may be electrically connected to the package upper pads 2130 on the package substrate 2100. In some example embodiments, in each of the first and second semiconductor packages 2003a and 2003b, the semiconductor chips 2200 may be electrically connected to each other by the connection structures including through silicon vias (TSV) instead of the bonding wiring.

In example embodiments, the controller 2002 and the semiconductor chips 2200 may be included in one package. In some example embodiments, the controller 2002 and the semiconductor chips 2200 may be mounted on a separate interposer substrate different from the main substrate 2001, and the controller 2002 and the semiconductor chips 2220 may be connected to each other by wirings formed on the interposer substrate.

Figure 3:
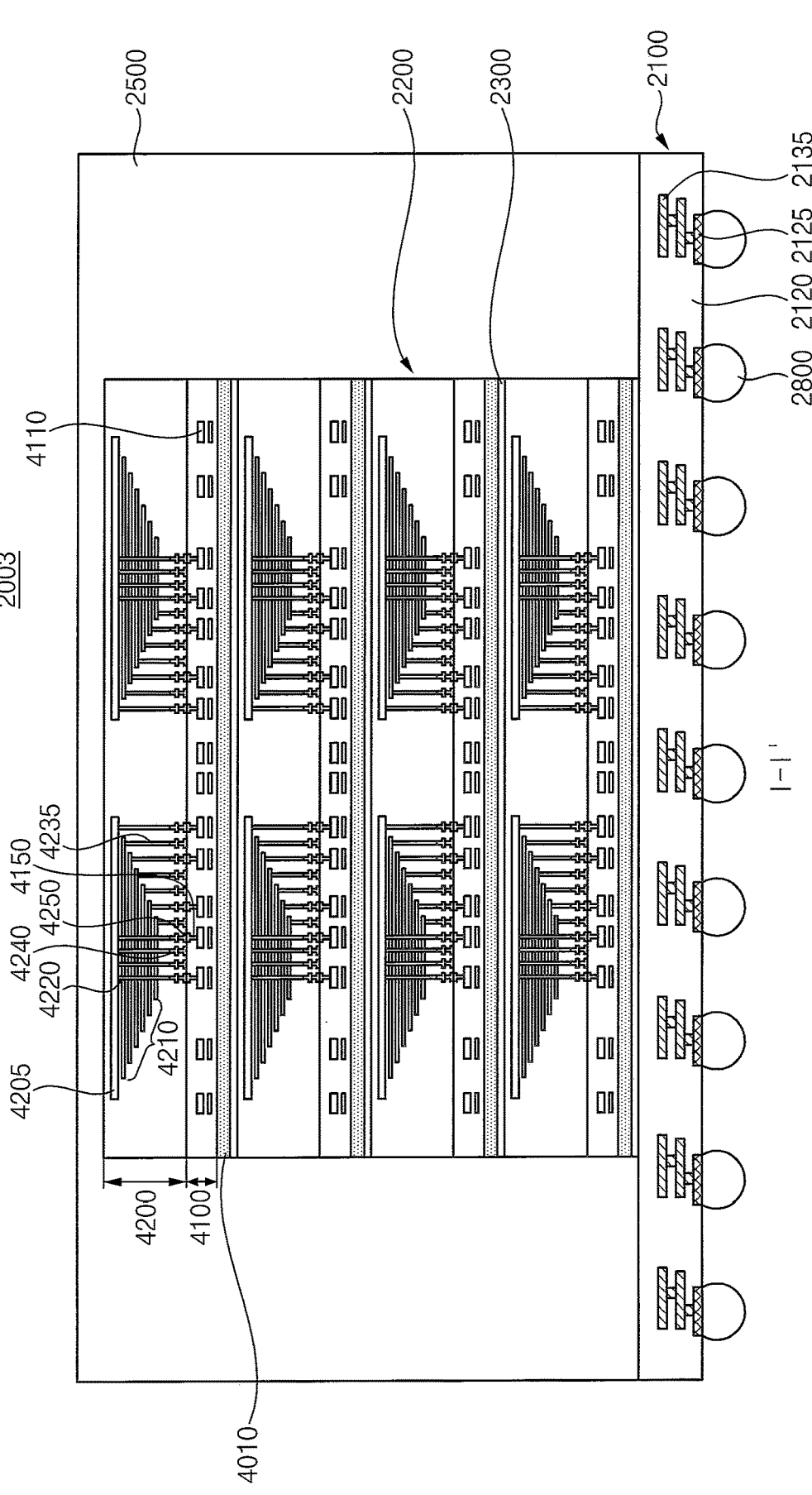
FIG. 3 is a schematic cross-sectional view illustrating a semiconductor package including a semiconductor device according to an exemplary embodiment.

FIG. 3 is a schematic cross-sectional view illustrating a semiconductor package including a semiconductor device according to an exemplary embodiment.

FIG. 3 is an example embodiment of the semiconductor package shown in FIG. 2. FIG. 3 conceptually show a portion along line of I-I' in FIG. 2.

Referring to FIG. 3, in the semiconductor package 2003, the package substrate 2100 may be a printed circuit board. The package substrate 2100 may include a package substrate body part 2120, package upper pads (refer to FIG. 2, 2130) disposed on an upper surface of the package substrate body part 2120, lower pads 2125 disposed at a lower surface of the package substrate body part 2120 or exposed through the lower surface of the package substrate body part 2120, and internal wirings 2135 for electrically connecting with the package upper pads 2130 and the lower pads 2125 in an inner portion of the package substrate body part 2120. The package upper pads 2130 may be electrically connected to the connection structures 2400. The lower pads 2125 may be connected to the wiring patterns 2005 of the main substrate 2001 in the electronic system 2000 as shown in FIG. 2 through the conductive connection parts 2800.

Each of the semiconductor chips 2200a may include a semiconductor substrate 4010, a first structure 4100 on the semiconductor substrate 4010, and a second structure 4200 bonded on the first structure 4100. The second structure 4200 may be bonded on the first structure 4100 by a wafer bonding process.

The first structure 4100 may include a peripheral circuit region in which a peripheral wiring 4110 and first bonding structures 4150 are formed.

The second structure 4200 may include a common source line 4205, a gate electrode structure 4210 between the common source line 4205 and the first structure 4100, memory channel structures 4220 and a separation structure (refer to FIG. 2, 3230) passing through the gate electrode structure 4210, and second bonding structures 4250 electrically connected to the word lines (refer to FIG. 1, WL) of the gate electrode structure 4210 and the memory channel structures 4220. For example, the second bonding structures 4250 may be electrically connected to the memory channel structures 4220 and the word lines (refer to FIG. 1, WL), through the bit lines 4240 for electrically the memory channel structures 4220 and gate connection wirings 4235 for connecting the word lines (refer to FIG. 1, WL).

The first bonding structures 4150 of the first structure 4100 and the second bonding structures 4250 of the second structure 4200 may be bonded to each other. A bonding portion between the first bonding structures 4150 and the second bonding structures 4250 may be formed of, e.g., copper (Cu).

Each of the semiconductor chips 2200a may further include an input/output pad (2210, referring to FIG. 2) electrically connected to the peripheral wirings 4110 of the first structure 4100.

The semiconductor chips 2200 shown in FIG. 3 may be electrically connected to each other by the connection structures 2400 of a wire bonding type. In some example embodiments, semiconductor chips in one semiconductor package, such as the semiconductor chips 2200 shown in FIG. 3, may be electrically connected to each other by the connection structures 2400 including the through silicon vias.

FIGS. 4 to 21 are cross-sectional views and a plan view illustrating a method of manufacturing a vertical semiconductor device according to exemplary embodiments.

Figure 9:
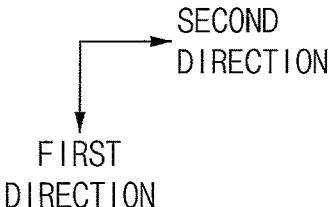

In this case, FIG. 9 is a plan view showing a portion of a vertical semiconductor device formed on a second substrate, and each of the cross-sectional views is taken along a line I-I' of FIG. 9.

Figure 4:
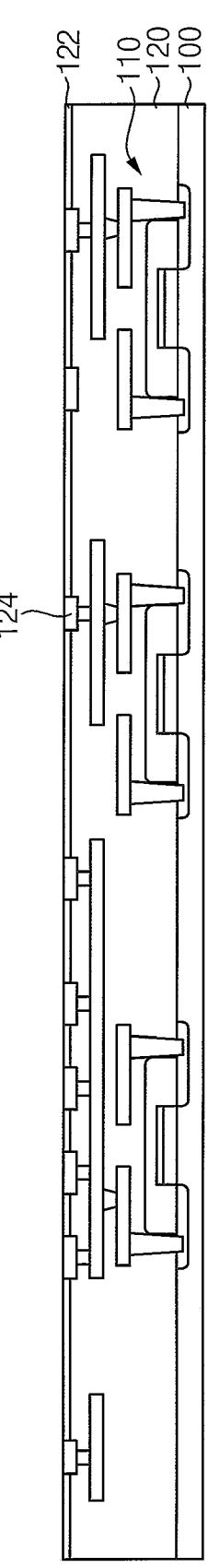

Referring to FIG. 4, lower circuit patterns 110 may be formed on a first substrate 100. The lower circuit patterns 110 may include peripheral circuits of a vertical semiconductor device. The lower circuit patterns 110 may include, for example, a transistor and a lower wire. A lower interlayer insulating layer 120 covering the lower circuit patterns 110 may be formed.

The first substrate 100 may include a semiconductor material such as silicon, germanium, or silicon-germanium, or a group III-V compound such as GaP, GaAs, or GaSb. According to some embodiments, the first substrate 100 may be a silicon-on-insulator (SOI) substrate or a germanium-on-insulator (GOI) substrate.

A first bonding layer 122 may be formed on an uppermost surface of the lower interlayer insulating layer 120. According to an exemplary embodiment, the first bonding layer 122 may include SiCN. A first bonding pattern 124 passing through the first bonding layer 122 may be formed on an upper portion of the lower interlayer insulating layer 120.

A surface of the first bonding pattern 124 and a surface of the first bonding layer 122 may be disposed on a same plane. The first bonding pattern 124 may include a metal material. As used herein, the term, "metal material" may mean a metal, an alloy, or a mixture of a metal with one or more other materials. The first bonding pattern 124 may include, for example, copper, aluminum, and the like. The first bonding pattern 124 may be electrically connected to lower wires included in the lower circuit patterns 110.

FIGS. 5 to 16 are views illustrating a process of forming vertical memory cells on a second substrate 200.

Figure 5:
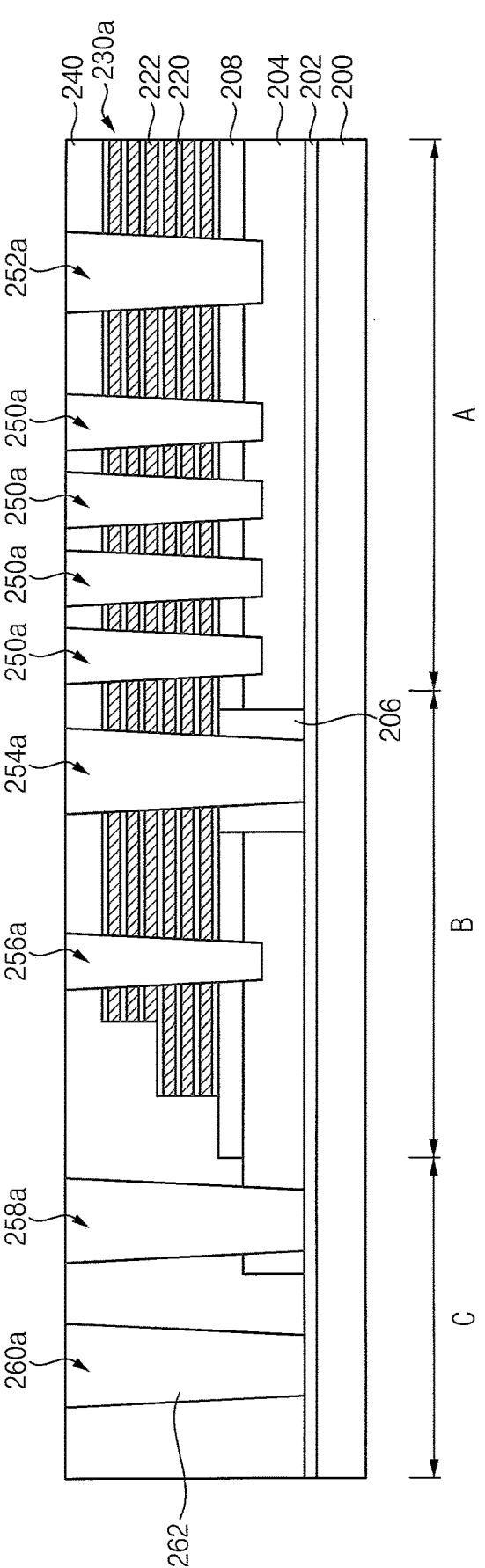

Referring to FIG. 5, the second substrate 200 may include a memory cell region A, a cell extension region B, and a through-wire region C. The cell extension region B may be adjacent to an edge of the memory cell region A. The through-wire region C may be disposed on an outer side of the cell extension region B.

A lower etching stop layer 202 may be formed on the second substrate 200. The lower etching stop layer 202 may include, for example, titanium, titanium nitride, aluminum oxide, and the like.

A base layer and a lower insulating pattern 206 may be formed on the lower etching stop layer 202. The base layer may become a common source plate electrode through a subsequent process. The base layer may include polysilicon.

The base layer may selectively include an opening in a region where a cell contact plug is to be formed, and the lower insulating pattern 206 may fill an inside of the opening. The lower etching stop layer 202 may be exposed through a bottom surface of the opening.

A lower sacrificial layer and a support layer may be formed on the lower insulating pattern 206 and the base layer. According to the exemplary embodiment, the lower sacrificial layer may be configured such that a silicon oxide layer, a silicon nitride layer, and a silicon oxide layer are sequentially formed. The support layer may include polysilicon.

A first insulating layer and a first sacrificial layer may be alternately and repeatedly stacked on the support layer in the vertical direction. The first insulating layer may include silicon oxide, and the first sacrificial layer may include silicon nitride.

Portions of the first insulating layers and the first sacrificial layers may be sequentially etched to form a first mold structure 230a having an edge region having a step shape. Subsequently, the support layer, the lower sacrificial layer, and the base layer may be etched to form a support layer pattern, a lower sacrificial structure 208, and a base pattern 204, respectively.

The first mold structure 230a may be formed on the memory cell region A and the cell extension region B of the second substrate 200. A region having the step shape in the first mold structure 230a may be disposed on the cell expansion region B.

The first mold structure 230a may have a structure in which a first insulating pattern 220 and a first sacrificial pattern 222 are alternately stacked.

A first interlayer insulating layer 240 covering the first mold structure 230a may be formed on the second substrate 200. Thereafter, a process of planarizing a top surface of the first interlayer insulating layer 240 may be further performed.

Next, the first interlayer insulating layer 240, the first mold structure 230a, the support layer pattern, the lower sacrificial structure 208, and the base pattern 204 may be etched to form holes and trenches at respective positions. For example, through the above process, a first channel hole 250a, a first word line cut opening 252a, a first cell contact hole 254a, a first dummy hole 256a, a first plate contact hole 258a, and a first through-hole 260a may be formed, respectively.

The first channel hole 250a may be formed through the first mold structure 230a on the memory cell region A, and may have a bottom surface through which a top portion of the base pattern 204 is exposed.

The first word line cut opening 252a may be formed through the first mold structure 230a on the memory cell region A, and may have a trench shape extending in the first direction. The top portion of the base pattern 204 may be exposed through a bottom surface of the first word line cut opening 252a.

The first cell contact hole 254a may be formed through the first mold structure 230a on the cell extension region B. In addition, the first cell contact hole 254a may be formed through the lower insulating pattern 206 to extend to a top portion of the lower etching stop layer 202.

The first dummy hole 256a may be formed through the first mold structure 230a on the cell extension region B, and may have a bottom surface through which the top portion of the base pattern 204 is exposed.

The first plate contact hole 258a may be formed through the first interlayer insulating layer 240 and the base pattern 204 on the through-wire region C. The first through-hole 260a may be formed through the first interlayer insulating layer 240 on the through-wire region C, and may have a bottom surface through which the top portion of the lower etching stop layer 202 is exposed.

A sidewall of each of the first channel hole 250a, the first word line cut opening 252a, the first cell contact hole 254a, the first dummy hole 256a, the first plate contact hole 258a, and the first through-hole 260a may have a sidewall inclination so that an inner width may gradually decrease in a downward direction, which is a direction toward the second substrate 200. Therefore, each of the first channel hole 250a, the first word line cut opening 252a, the first cell contact hole 254a, the first dummy hole 256a, the first plate contact hole 258a, and the first through-hole 260a may have a lower width that is narrower than an upper width.

A first embedded sacrificial pattern 262 may fill insides of the first channel hole 250a, the first word line cut opening 252a, the first cell contact hole 254a, the first dummy hole 256a, the first plate contact hole 258a, and the first through-hole 260a. The first embedded sacrificial pattern 262 may include, for example, polysilicon.

Figure 6:
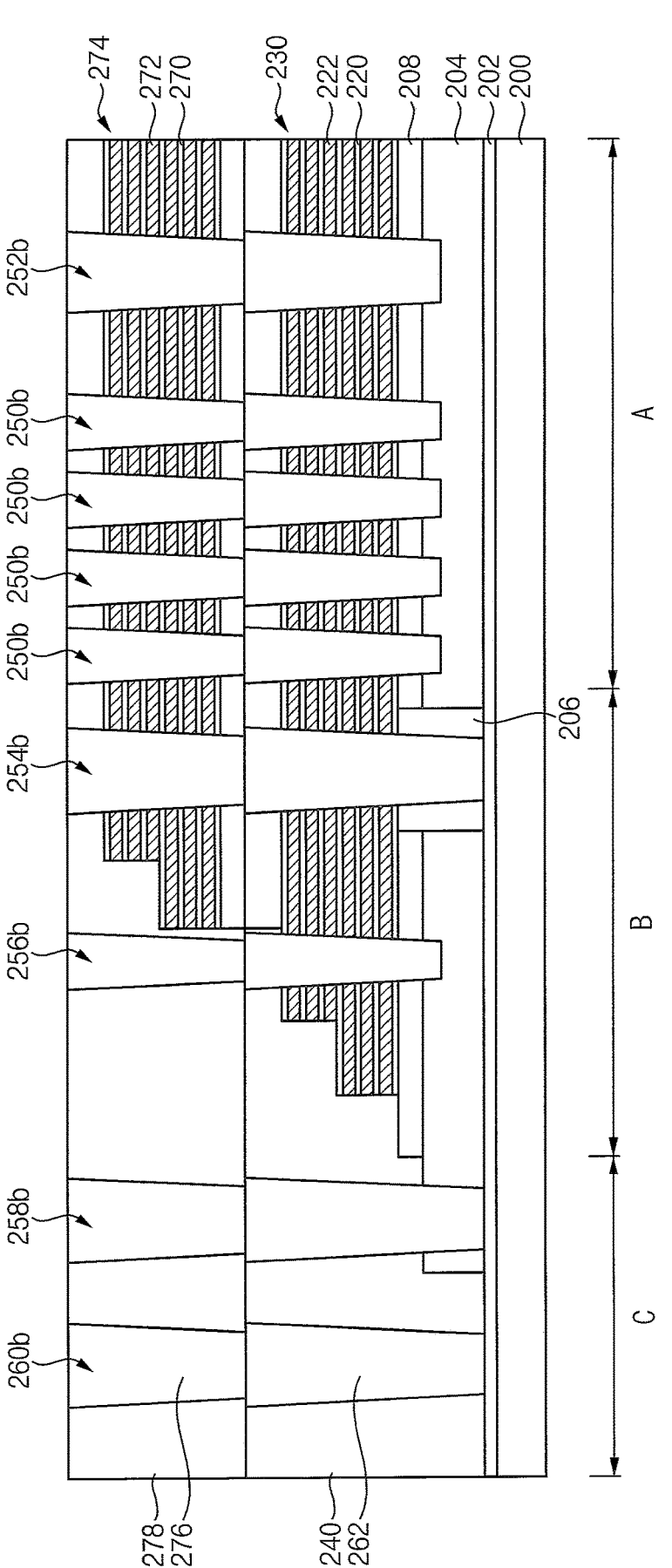

Referring to FIG. 6, a second insulating layer and a second sacrificial layer may be alternately and repeatedly stacked on the first interlayer insulating layer 240 and the first embedded sacrificial pattern 262 in the vertical direction.

The second insulating layers and the second sacrificial layers may be sequentially etched to form a second mold structure 274 having an edge region having a step shape. The second mold structure 274 may have a structure in which a second insulating pattern 270 and a second sacrificial pattern 272 are stacked.

A second interlayer insulating layer 278 covering the second mold structure 274 may be formed on the first interlayer insulating layer 240. Thereafter, a process of planarizing a top surface of the second interlayer insulating layer 278 may be further performed. The first and second interlayer insulating layers 240 and 278 may include a same material. The first and second interlayer insulating layers 240 and 278 may include silicon oxide.

The second interlayer insulating layer 278 and the second mold structure 274 may be etched to form holes and trenches through the second interlayer insulating layer 278 and/or the second mold structure 274 to expose a top surface of the first embedded sacrificial pattern 262. For example, through the above process, according to positions, a second channel hole 250b, a second word line cut opening 252b, a second cell contact hole 254b, a second dummy hole 256b, a second plate contact hole 258b, and a second through-hole 260b may be formed, respectively.

The second channel hole 250b may communicate with the first channel hole 250a. The second word line cut opening 252b may communicate with the first word line cut opening 252a. The second cell contact hole 254b may communicate with the first cell contact hole 254a. The second dummy hole 256b may communicate with the first dummy hole 256a. The second plate contact hole 258b may communicate with the first plate contact hole 258a. The second through-hole 260b may communicate with the first through-hole 260a. As used in this context, the phrase "may communicate" means that the two elements open into one another.

A sidewall of each of the second channel hole 250b, the second word line cut opening 252b, the second cell contact hole 254b, the second dummy hole 256b, the second plate contact hole 258b, and the second through-hole 260b may have an inclination so that an inner width may be gradually narrowed in the downward direction. Therefore, each of the second channel hole 250b, the second word line cut opening 252b, the second cell contact hole 254b, the second dummy hole 256b, the second plate contact hole 258b, and the second through-hole 260b may have a lower width that is narrower than an upper width.

A second embedded sacrificial pattern 276 may fill insides of the second channel hole 250b, the second word line cut opening 252b, the second cell contact hole 254b, the second dummy hole 256b, the second plate contact hole 258b, and the second through-hole 260b. The second embedded sacrificial pattern 276 may include a same material as the first embedded sacrificial pattern 262. The second embedded sacrificial pattern 276 may include polysilicon.

Figure 7:
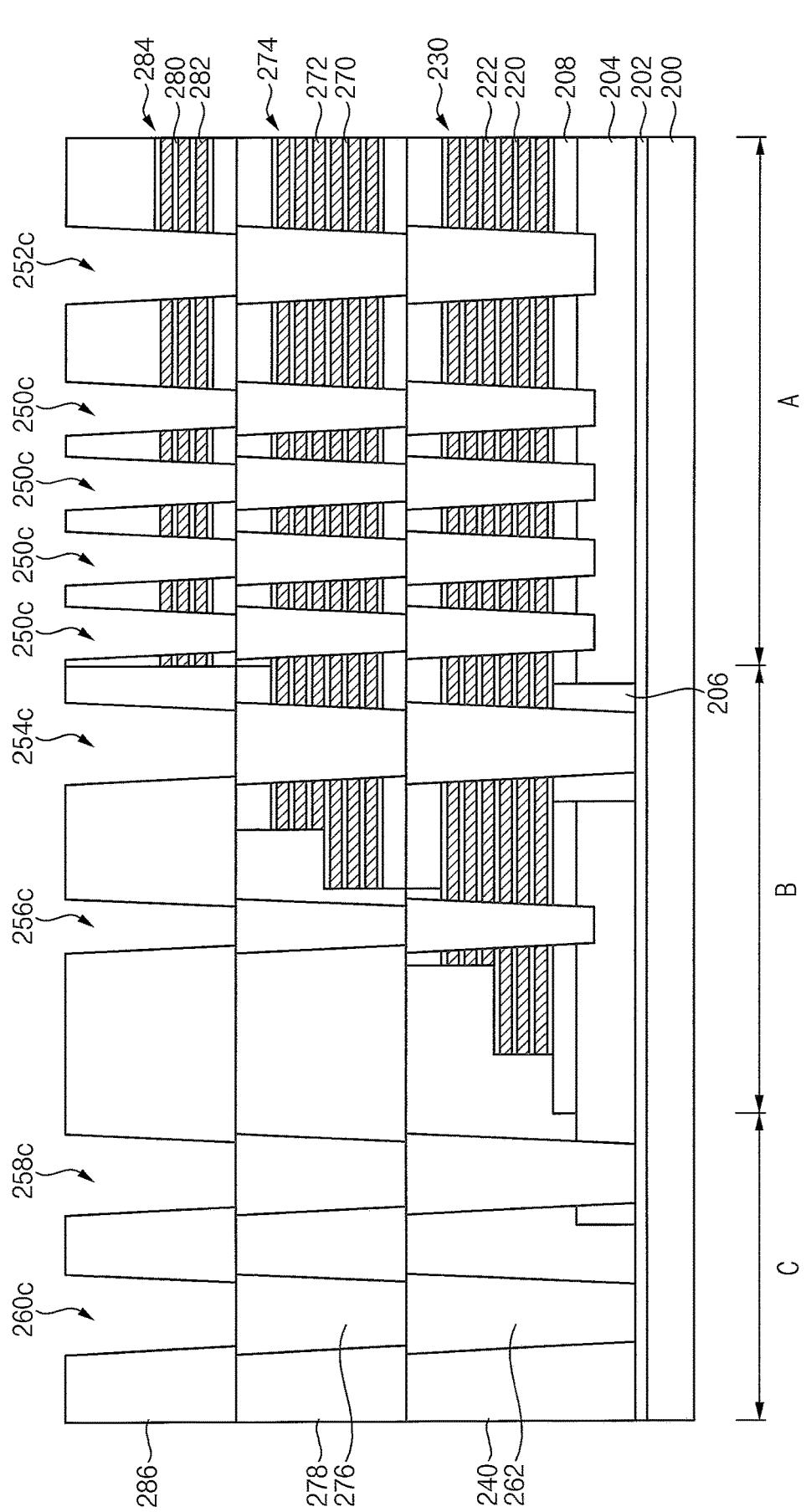

Referring to FIG. 7, a third insulating layer and a third sacrificial layer may be alternately and repeatedly stacked on the second interlayer insulating layer 278 and the second embedded sacrificial pattern 276 in the vertical direction.

The third insulating layers and the third sacrificial layers may be sequentially etched to form a third mold structure 284 having an edge region having a step shape. The third mold structure 284 may have a structure in which a third insulating pattern 280 and a third sacrificial pattern 282 are stacked. Therefore, a mold structure in which the first to third mold structures 230a, 274, and 284 are stacked may be formed. An edge region of the mold structure may have a step shape in which a length gradually increases from a bottom to a top.

A third interlayer insulating layer 286 covering the third mold structure 284 may be formed on the second interlayer insulating layer 278. Thereafter, a process of planarizing a top surface of the third interlayer insulating layer 286 may be further performed.

The third interlayer insulating layer 286 and the third mold structure 284 may be etched to form holes and trenches formed through the third interlayer insulating layer 286 and/or the third mold structure 284 to expose a top surface of the second embedded sacrificial pattern 276. For example, through the above process, according to positions, a third channel hole 250c, a third word line cut opening 252c, a third cell contact hole 254c, a third dummy hole 256c, a third plate contact hole 258c, and a third through-hole 260c may be formed, respectively.

A sidewall of each of the third channel hole 250c, the third word line cut opening 252c, the third cell contact hole 254c, the third dummy hole 256c, the third plate contact hole 258c, and the third through-hole 260c may have an inclination so that an inner width may be gradually narrowed in the downward direction. Therefore, each of the third channel hole 250c, the third word line cut opening 252c, the third cell contact hole 254c, the third dummy hole 256c, the third plate contact hole 258c, and the third through-hole 260c may have a lower width that is narrower than an upper width.

Figure 8:
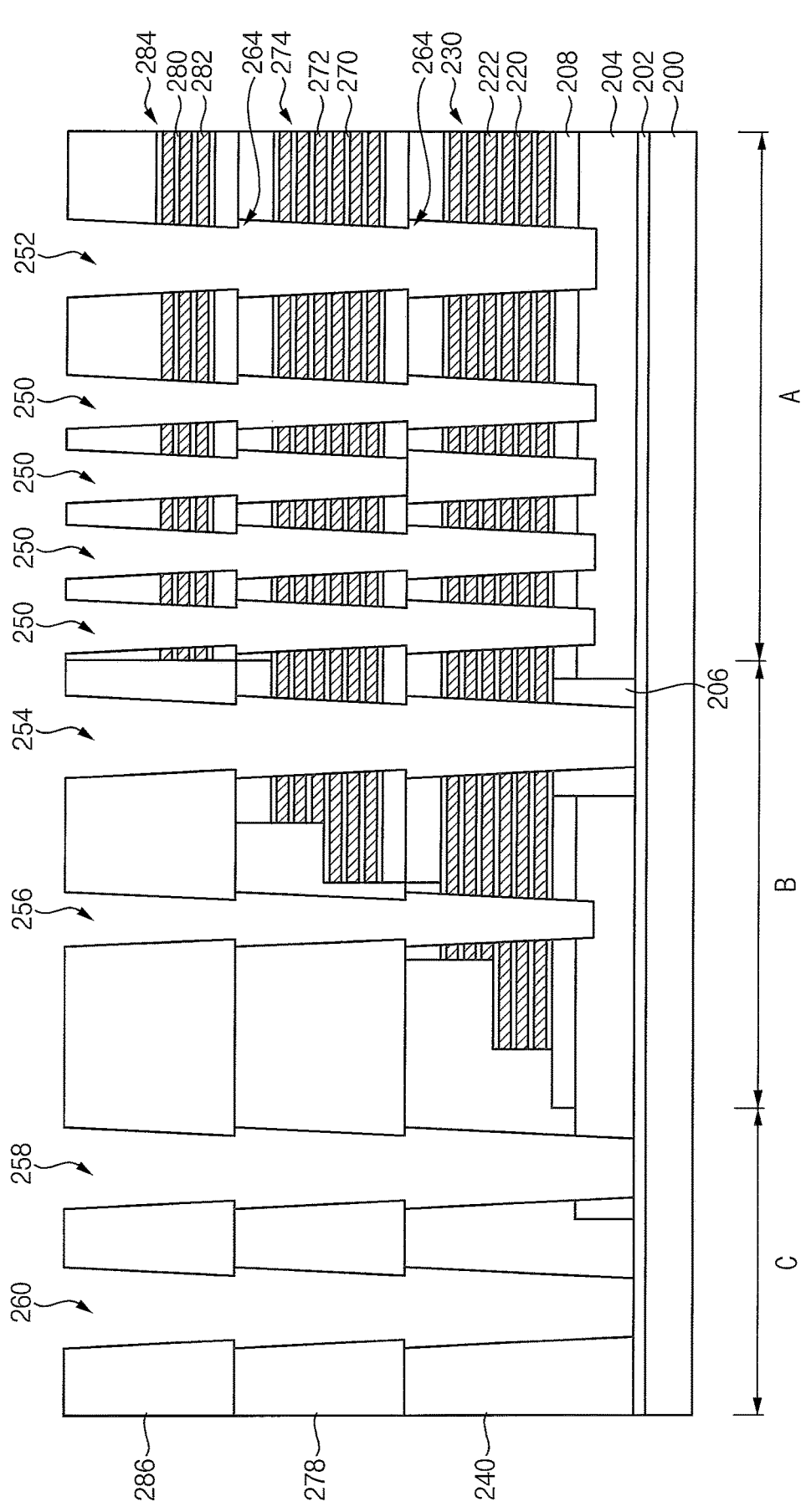

Referring to FIGS. 8 and 9, the second embedded sacrificial pattern 276 and the first embedded sacrificial pattern 262 formed in a lower portion of each of the holes and trenches may be removed to form a channel hole 250, a word line cut opening 252, a cell contact hole 254, a dummy hole 256, a plate contact hole 258, and a through-hole 260.

The channel hole 250 may be configured such that the first to third channel holes 250a, 250b, and 250c communicate with each other. The word line cut opening 252 may be configured such that the first to third word line cut openings 252a, 252b, and 252c communicate with each other. The cell contact hole 254 may be configured such that the first to third cell contact holes 254a, 254b, and 254c communicate with each other. The dummy hole 256 may be configured such that the first to third dummy holes 256a, 256b, and 256c communicate with each other. The plate contact hole 258 may be configured such that the first to third plate contact holes 258a, 258b, and 258c communicate with each other. The through-hole 260 may be configured such that the first to third through-holes 260a, 260b, and 260c communicate with each other.

A region of each of the holes in which holes disposed on upper and lower sides contact each other may have a difference in an inner width, so that the hole may include a bent part 264. In addition, a region of the word line cut opening 252 in which openings disposed on upper and lower sides contact each other may have a difference in an inner width, so that the word line cut opening 252 may include a bent part 264.

Figure 10:
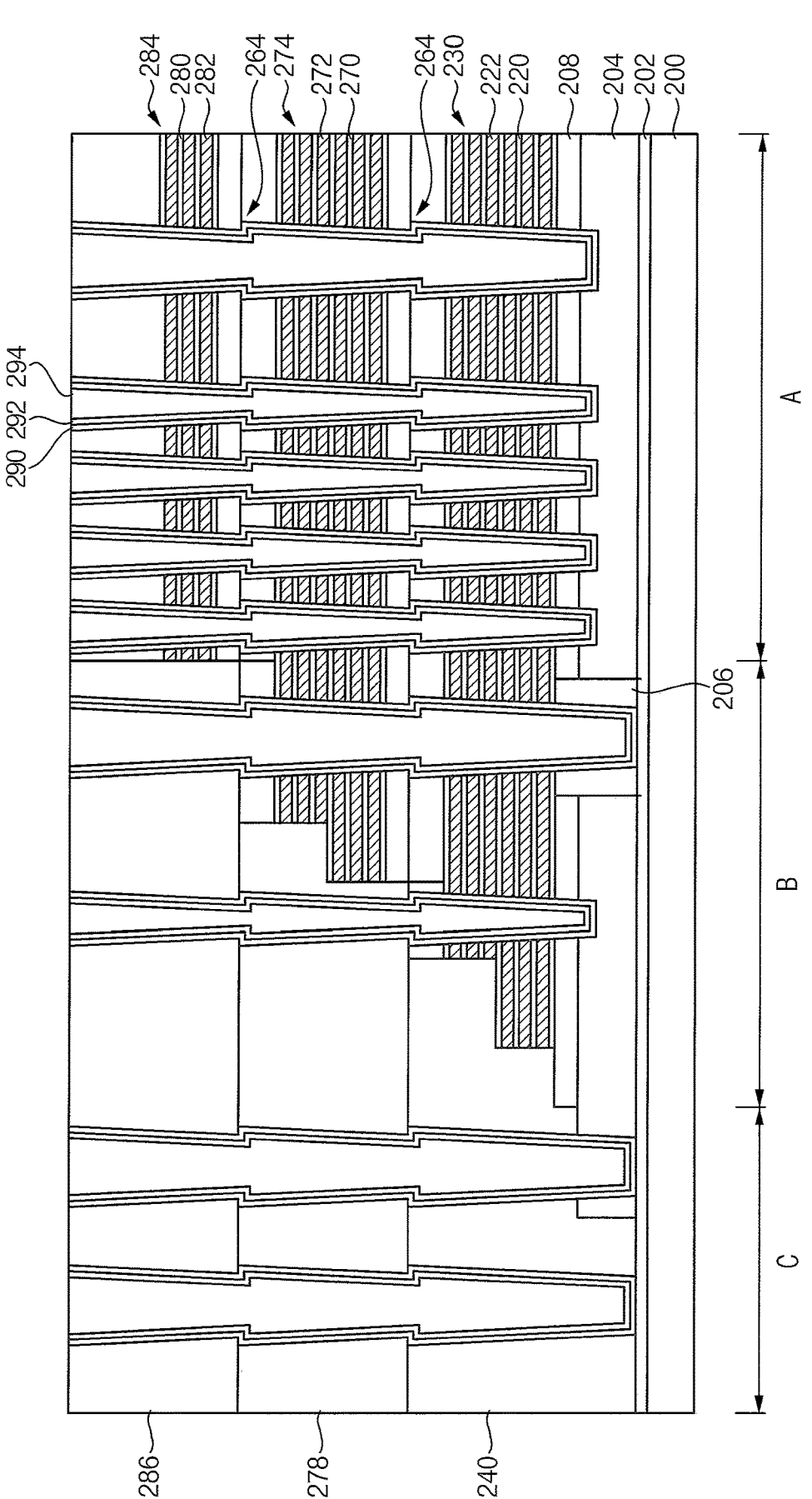

Referring to FIG. 10, a first blocking dielectric layer, a charge storage layer, and a tunnel insulating layer may be sequentially formed on the third interlayer insulating layer 286 and surfaces of the channel hole 250, the word line cut opening 252, the cell contact hole 254, the dummy hole 256, the plate contact hole 258, and the through-hole 260. In order to simplify the drawing, a layer in which the first blocking dielectric layer, the charge storage layer, and the tunnel insulating layer are stacked has been shown as one layer 290. A channel layer may be formed on the tunnel insulating layer.

The first blocking dielectric layer may include silicon oxide, the charge storage layer may include silicon nitride, and the tunnel insulating layer may include silicon oxide. The channel layer may include polysilicon.

An embedded insulating layer may be formed on the channel layer to completely fill insides of the channel hole 250, the word line cut opening 252, the cell contact hole 254, the dummy hole 256, the plate contact hole 258, and the through-hole 260. The embedded insulating layer may include oxide, which may be, for example, silicon oxide.

The embedded insulating layer, the channel layer, the first blocking dielectric layer, the charge storage layer, and the tunnel insulating layer may be planarized until the top surface of the third interlayer insulating layer 286 is exposed. Therefore, a first blocking dielectric layer pattern, a charge storage layer pattern, a tunnel insulating layer pattern, a channel 292, and a first embedded insulating pattern 294 may be formed inside the channel hole 250, the word line cut opening 252, the cell contact hole 254, the dummy hole 256, the plate contact hole 258, and the through-hole 260.

Figure 11:
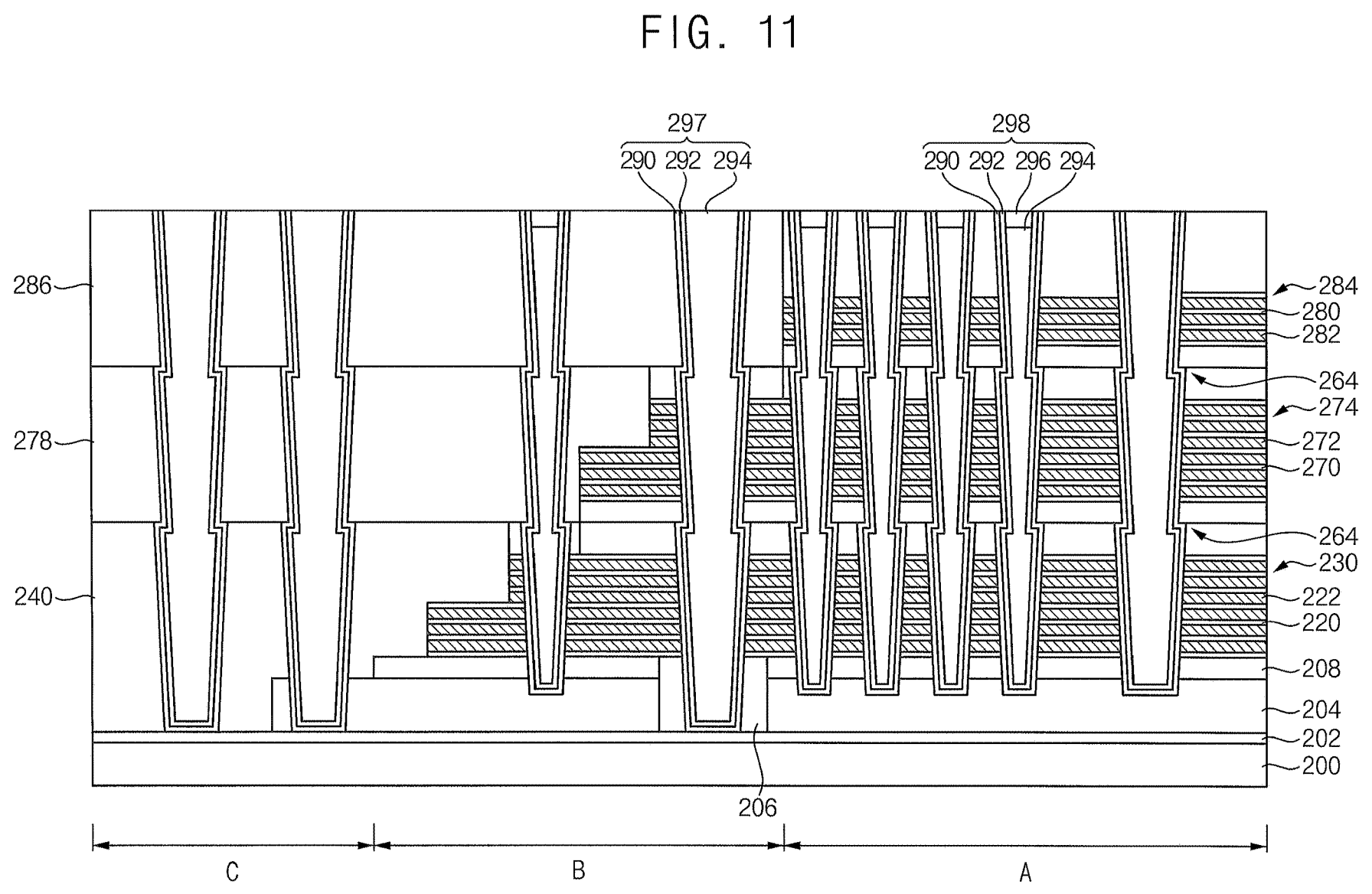

Referring to FIG. 11, upper portions of the first embedded insulating pattern 294 and the channel 292 formed inside the channel hole 250 and the dummy hole 256 may be selectively removed to form a first recess, and a capping pattern 296 may be formed inside the first recess. The capping pattern 296 may include, for example, polysilicon doped or undoped with impurities.

Accordingly, a first sacrificial pattern structure 297 including the first blocking dielectric layer pattern, the charge storage layer pattern, the tunnel insulating layer pattern, the channel 292, and the first embedded insulating pattern 294 may be formed inside the word line cut opening 252, the cell contact hole 254, the plate contact hole 258, and the through-hole 260. In addition, the first blocking dielectric layer pattern, the charge storage layer pattern, the tunnel insulating layer pattern, the channel 292, the first embedded insulating pattern 294, and the capping pattern 296 may be formed inside the channel hole 250 and the dummy hole 256. The first blocking dielectric layer pattern, the charge storage layer pattern, the tunnel insulating layer pattern, the channel 292, the first embedded insulating pattern 294, and the capping pattern 296 included in the channel hole 250 may be a channel structure 298. The first blocking dielectric layer pattern, the charge storage layer pattern, the tunnel insulating layer pattern, the channel 292, the first embedded insulating pattern 294, and the capping pattern 296 included in the dummy hole 256 may be a dummy structure. The dummy structure may be used as a support.

Figure 12:
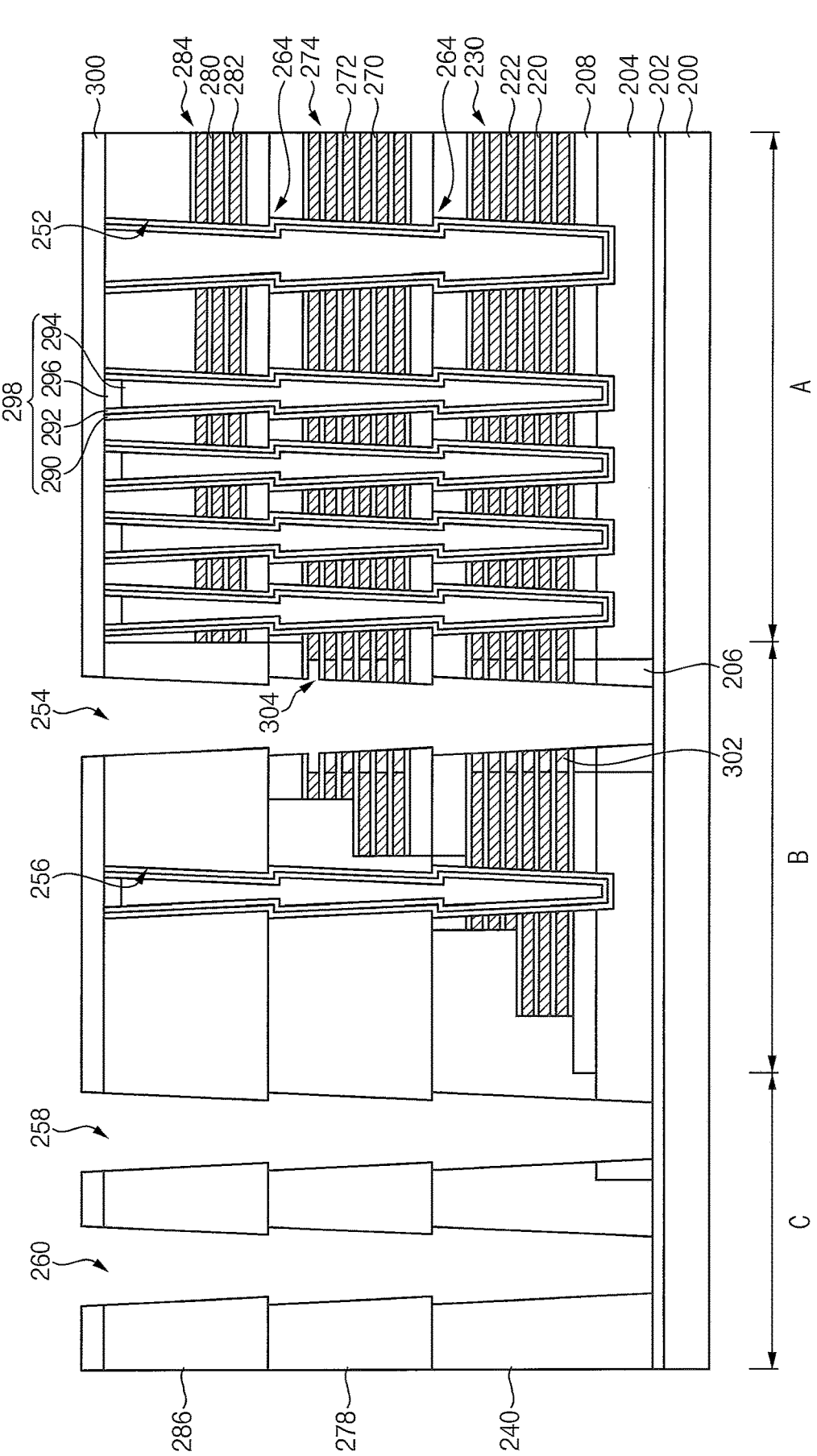

Referring to FIG. 12, a fourth interlayer insulating layer 300 may be formed on the mold structure and the third interlayer insulating layer 286. The fourth interlayer insulating layer 300 may cover top portions of the channel hole 250, the word line cut opening 252, the cell contact hole 254, the dummy hole 256, the plate contact hole 258, and the through-hole 260. The fourth interlayer insulating layer 300 may include silicon oxide.

Thereafter, the fourth interlayer insulating layer 300 formed on the cell contact hole 254, the plate contact hole 258, and the through-hole 260 may be selectively removed. In addition, the first sacrificial pattern structure 297 formed inside the cell contact hole 254, the plate contact hole 258, and the through-hole 260 may be removed.

Therefore, the lower etching stop layer 202 may be exposed through bottom surfaces of the cell contact hole 254, the plate contact hole 258, and the through-hole 260. Since the cell contact hole 254, the plate contact hole 258, and the through-hole 260 extend in the downward direction from a top surface of the fourth interlayer insulating layer 300, the top portions of the cell contact hole 254, the plate contact hole 258, and the through-hole 260 may be higher than the top portions of the channel hole 250, the word line cut opening 252, and the dummy hole 256, with respect to a distance from the second substrate.

Thereafter, the first to third sacrificial patterns 222, 272, and 282 in the mold structure exposed to a sidewall of the cell contact hole 254 may be partially etched to form a recess. An insulating material may be formed inside the recess to form a fourth insulating pattern 302. In this case, an uppermost recess among recesses formed in the sidewall of the cell contact hole 254 will be referred to as a second recess 304, and the fourth insulating pattern 302 might not be formed in the second recess. For example, the cell contact hole 254 may communicate with the second recess 304.

Figure 13:
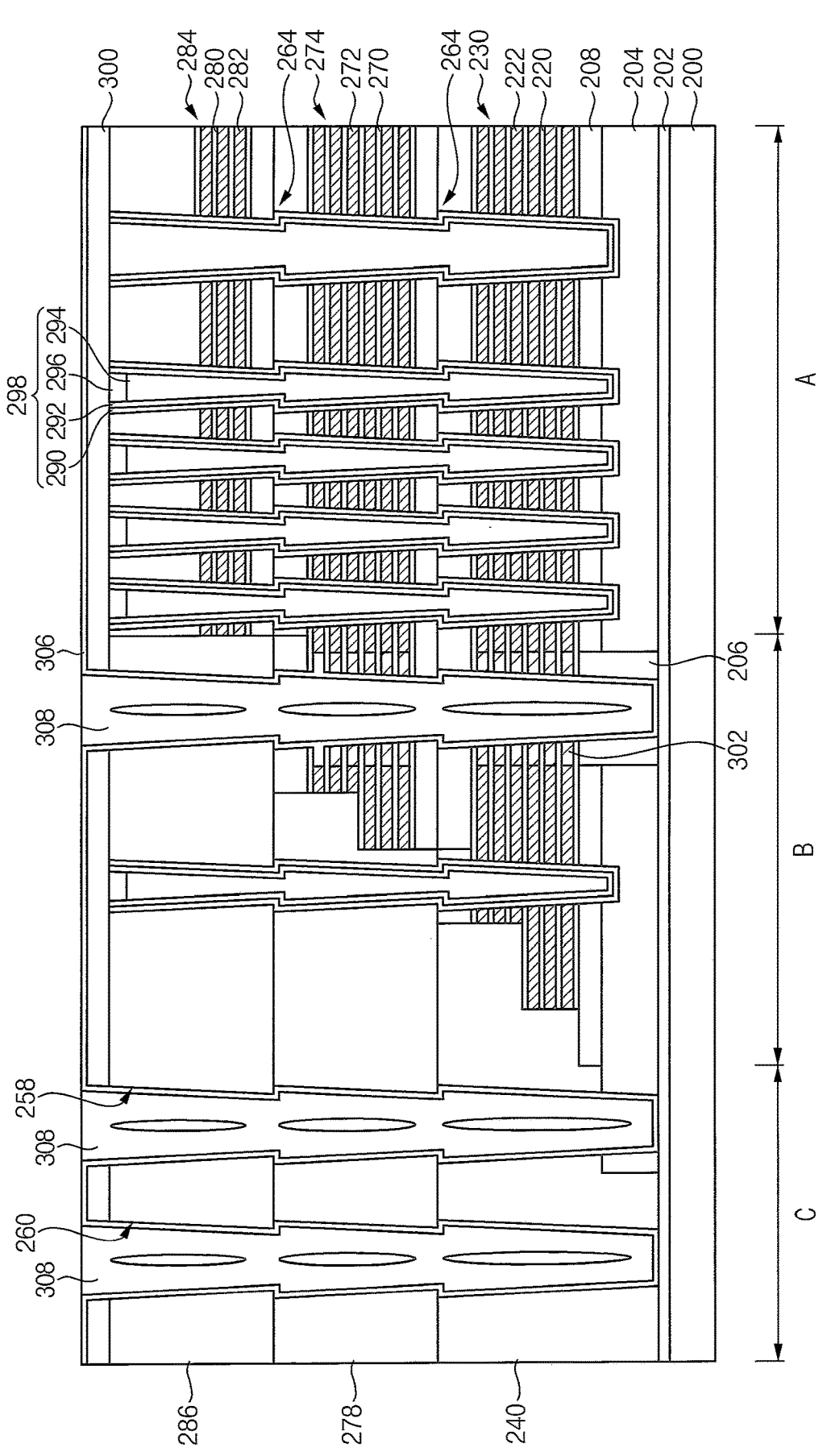

Referring to FIG. 13, a first silicon oxide layer liner 306 may be formed on the fourth interlayer insulating layer 300 and surfaces of the cell contact hole 254, the second recess 304, the plate contact hole 258, and the through-hole 260. The first silicon oxide layer liner 306 may fill an inside of the second recess 304.

A third embedded sacrificial layer may be formed on the fourth interlayer insulating layer 300, the first silicon oxide layer liner 306, and the lower etching stop layer 202 and may fill insides of the cell contact hole 254, the plate contact hole 258, and the through-hole 260. The third embedded sacrificial layer may include, for example, polysilicon.

Thereafter, the third embedded sacrificial layer may be planarized to expose the first silicon oxide layer liner 306. Therefore, a third embedded sacrificial pattern 308 that fills the inside of the cell contact hole 254, the plate contact hole 258, and the through-hole 260 may be formed on the first silicon oxide layer liner 306. The third embedded sacrificial pattern 308 may include polysilicon. Avoid may be included in the third embedded sacrificial pattern 308. In some exemplary embodiments, the void might not be formed inside the third embedded sacrificial pattern 308. Since the fourth interlayer insulating layer 300 and the first silicon oxide layer liner 306 may be formed of silicon oxide, the fourth interlayer insulating layer 300 and the first silicon oxide layer liner 306 may be merged into one layer.

Figure 14:
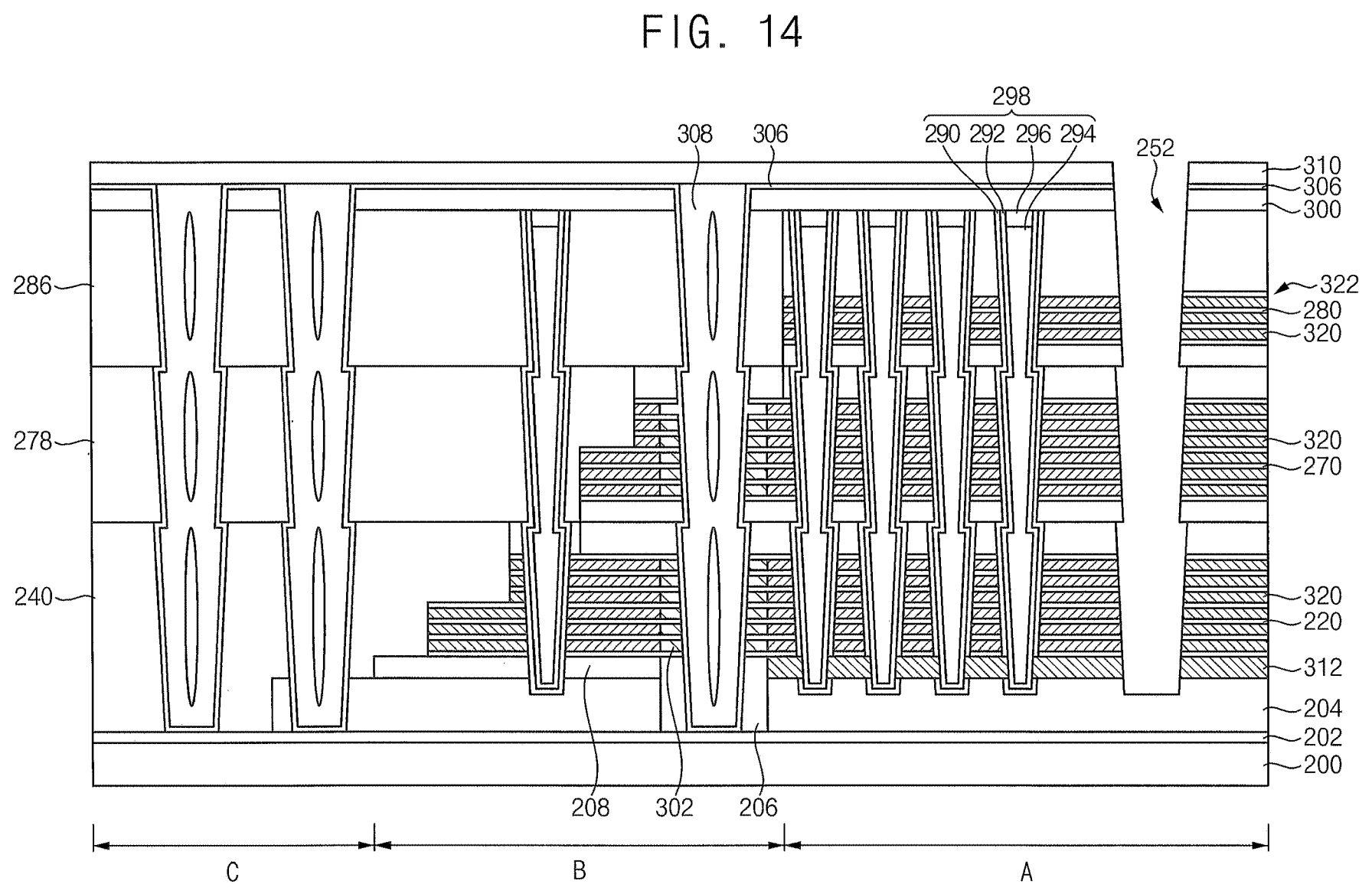

Referring to FIG. 14, a fifth interlayer insulating layer 310 may be formed on the first silicon oxide layer liner 306 and the third embedded sacrificial pattern 308. The fifth interlayer insulating layer 310 may include silicon oxide.

The fifth interlayer insulating layer 310 and the fourth interlayer insulating layer 300 formed on the word line cut opening 252 may be etched. In addition, the first blocking dielectric layer pattern, the charge storage layer pattern, the tunnel insulating layer pattern, the channel 292, and the first embedded insulating pattern 294, which are formed inside the word line cut opening 252, may be removed.

Therefore, the base pattern 204 may be exposed through a bottom surface of the word line cut opening 252. Since the word line cut opening 252 extends in the downward direction from a top surface of the fifth interlayer insulating layer 310, a top portion of the word line cut opening 252 may be higher than top portions of the cell contact hole 254, the plate contact hole 258, and the through-hole 260, with respect to a distance from the second substrate. For example, the top portions of the cell contact hole 254, the plate contact hole 258, and the through-hole 260 may be lower than the top portion of the word line cut opening 252 and higher than the top portions of the channel hole 250 and the dummy hole 256, with respect to a distance from the second substrate.

Thereafter, a spacer may be formed on a sidewall of the word line cut opening 252, and the lower sacrificial structure 208 may be partially removed. Therefore, a first gap may be formed between the support layer pattern and the base pattern 204. A top surface of the base pattern 204 may be exposed through a bottom surface of the first gap.

In addition, the first blocking dielectric layer pattern, the charge storage layer pattern, and the tunnel insulating layer pattern, which are exposed by the first gap, may be removed to expose an outer sidewall of the channel 292 through the first gap. Therefore, lower portions of the first blocking dielectric layer pattern, the charge storage layer pattern, and the tunnel insulating layer pattern may be partially cut to be separated into upper and lower portions.

Thereafter, the spacer may be removed. A channel connection pattern 312 that fills the first gap may be formed. The channel connection pattern 312 may contact lower sidewalls of the channels 292 to electrically connect lower portions of the channels 292 to each other. In addition, the channel connection pattern 312 may contact the top surface of the base pattern 204 to electrically connect the channels 292 and the base pattern 204 to each other. The channel connection pattern 312 may include polysilicon doped with impurities.

Next, the first to third sacrificial patterns 222, 272, and 282 in the mold structure may be removed through the sidewall of the word line cut opening 252 to form a second gap. An outer sidewall of the first blocking dielectric layer pattern may be partially exposed by the second gap.

A second blocking dielectric layer may be formed on surfaces of the word line cut opening 252 and the second gap and the top surface of the fifth interlayer insulating layer 310, and a gate electrode layer may be formed on the second blocking dielectric layer. Thereafter, a gate electrode layer may be partially removed to form a gate electrode 320 inside each of the second gaps.

According to exemplary embodiments, the gate electrode 320 may extend in the first direction, and a plurality of gate electrodes 320 may be stacked while being spaced apart from each other in the vertical direction.

Therefore, a pattern structure 322 in which the gate electrode 320 and the insulating patterns 220, 270, and 280 are repeatedly stacked may be formed on the base pattern 204.

The pattern structure 322 may include first to third pattern structures. The first pattern structure may be formed from the first mold structure, the second pattern structure may be formed from the second mold structure, and the third pattern structure may be formed from the third mold structure.

The pattern structure 322 may extend in the first direction. The pattern structures 322 may be spaced apart from each other by the word line cut opening 252.

Figure 15:
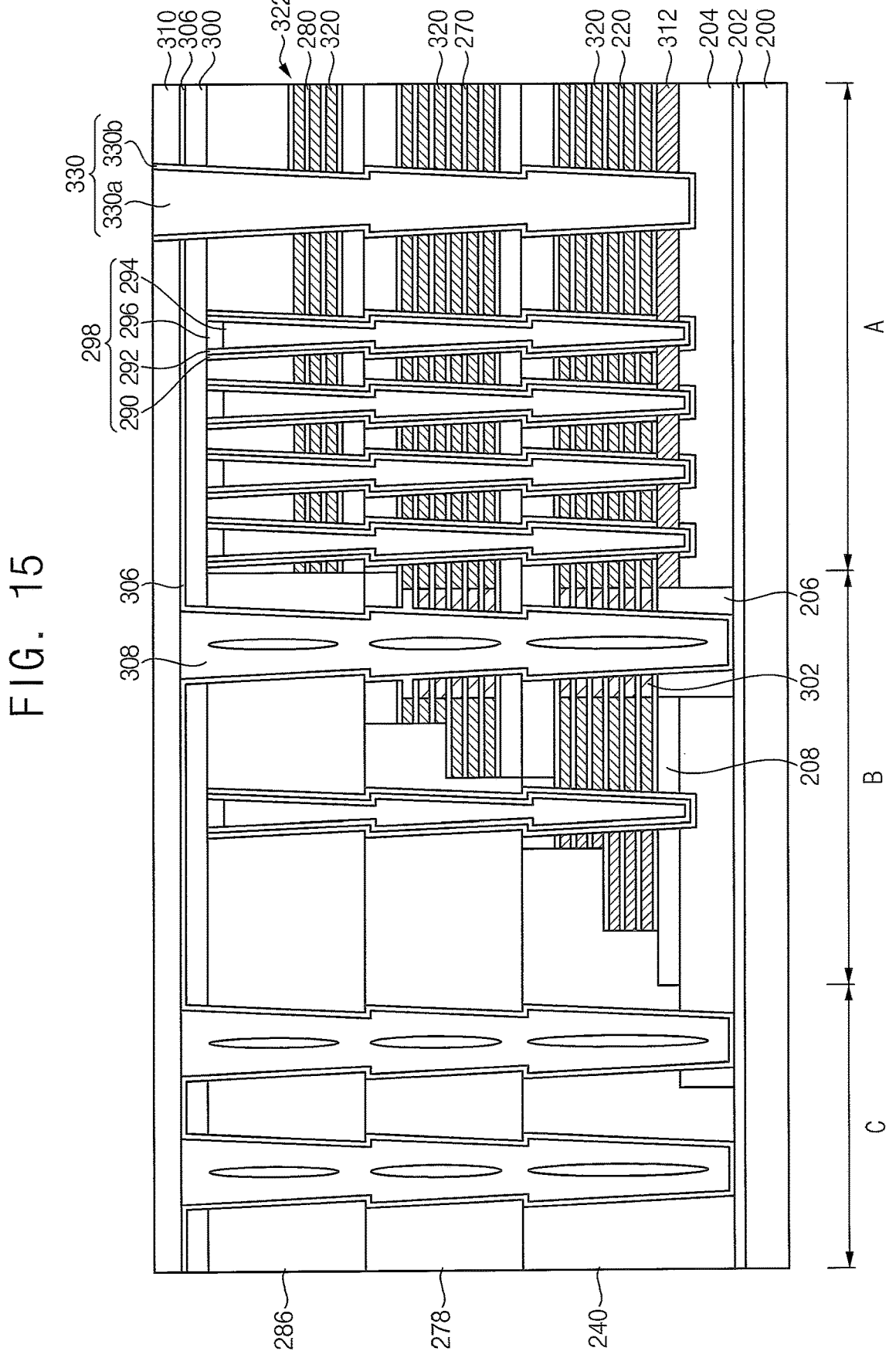

Referring to FIG. 15, a second embedded insulating pattern 330 that fills the inside of the word line cut opening 252 may be formed. According to the exemplary embodiment, the second embedded insulating pattern 330 may include a second silicon oxide layer liner 330a and an embedded oxide layer pattern 330b.

Figure 16:
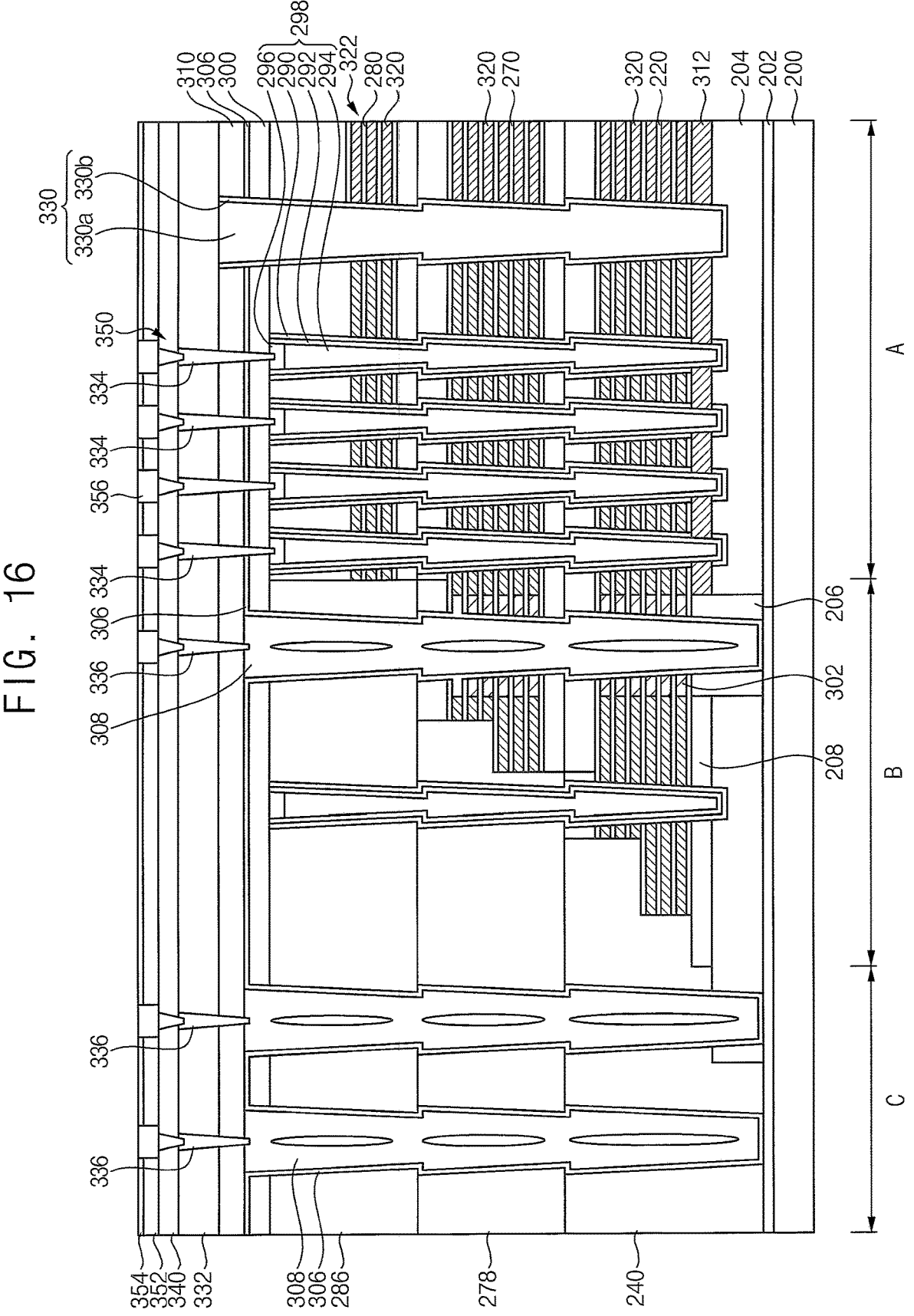

Referring to FIG. 16, a sixth interlayer insulating layer 332 may be formed on the fifth interlayer insulating layer 310 and the second embedded insulating pattern 330. The sixth interlayer insulating layer 332 may include silicon oxide.

A first contact plug 334 passing through the sixth interlayer insulating layer 332, the fifth interlayer insulating layer 310, and the fourth interlayer insulating layer 300 to contact the capping pattern 296 of each of the channel structures 298 may be formed. In addition, a second contact plug 336 passing through the sixth interlayer insulating layer 332 and the fifth interlayer insulating layer 310 to contact the third embedded sacrificial pattern 308 in the cell contact hole 254, the plate contact hole 258, and the through-hole 260 may be formed. According to the exemplary embodiment, a bottom surface of the second contact plug 336 may be the same as a top surface of the third embedded sacrificial pattern 308 in the cell contact hole 254, the plate contact hole 258, and the through-hole 260, or may be formed lower than the top surface of the third embedded sacrificial pattern 308. According to the exemplary embodiment, the second contact plug 336 may include a metal material. For example, the second contact plug 336 may include tungsten.

A seventh interlayer insulating layer 340 may be formed on the sixth interlayer insulating layer 332, the first contact plug 334, and the second contact plug 336. A first wire 350 passing through the seventh interlayer insulating layer 340 to be electrically connected to the first and second contact plugs 334 and 336 may be formed. According to the exemplary embodiment, the first wire 350 may include a contact plug and a conductive line. The first wire 350 may include a metal material. According to the exemplary embodiment, the first wire 350 may be formed through a dual damascene process or a single damascene process.

Thereafter, wires may be further formed in multiple layers on the seventh interlayer insulating layer 340.

An eighth interlayer insulating layer 352 may be formed on the seventh interlayer insulating layer 340.

A second bonding layer 354 may be formed on the eighth interlayer insulating layer 352. According to the exemplary embodiment, the second bonding layer 354 may include a same material as the first bonding layer 122 formed on the first substrate 100. For example, the second bonding layer 354 may include SiCN.

A second bonding pattern 356 passing through the eighth interlayer insulating layer 352 and the second bonding layer 354 to be electrically connected to the first wire 350 may be formed. A top surface of the second bonding pattern 356 may be disposed on a same plane as a top surface of the second bonding layer 354, and may be externally exposed.

According to the exemplary embodiments, the second bonding pattern 356 may be formed through a dual damascene process or a single damascene process.

The second bonding pattern 356 may include a metal material. According to the exemplary embodiment, the second bonding pattern 356 may include a same material as the first bonding pattern 124. For example, the second bonding pattern 356 may include copper, aluminum, and the like.

Figure 17:
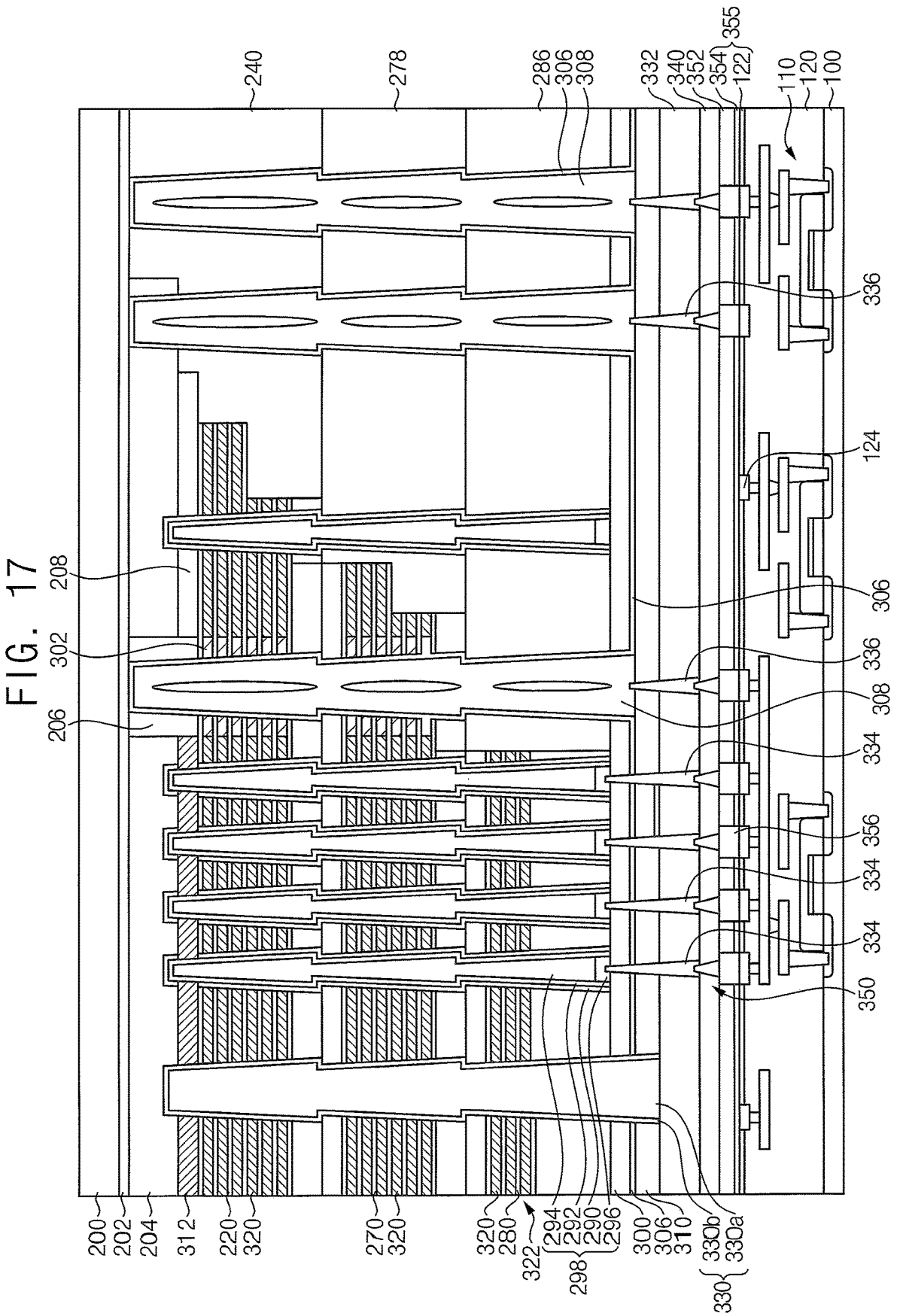

Referring to FIG. 17, the second substrate 200 may be rotated by 180 degrees. Thereafter, the second bonding layer 354 formed on the second substrate 200 may be bonded to the first bonding layer 122 formed on the first substrate 100. The first bonding layer 122 and the second bonding layer 354 may be formed as one bonding layer 355.

The first substrate 100 and the second substrate 200 may be bonded to each other so as to form one body. In this case, upper and lower positions of the structures formed on the second substrate 200 may be inverted, and a vertical relation will be described below based on an inverted state. For example, in the following description, a region close to the first substrate will be defined as a lower portion, and a region close to the base pattern will be defined as an upper portion.

Figure 18:
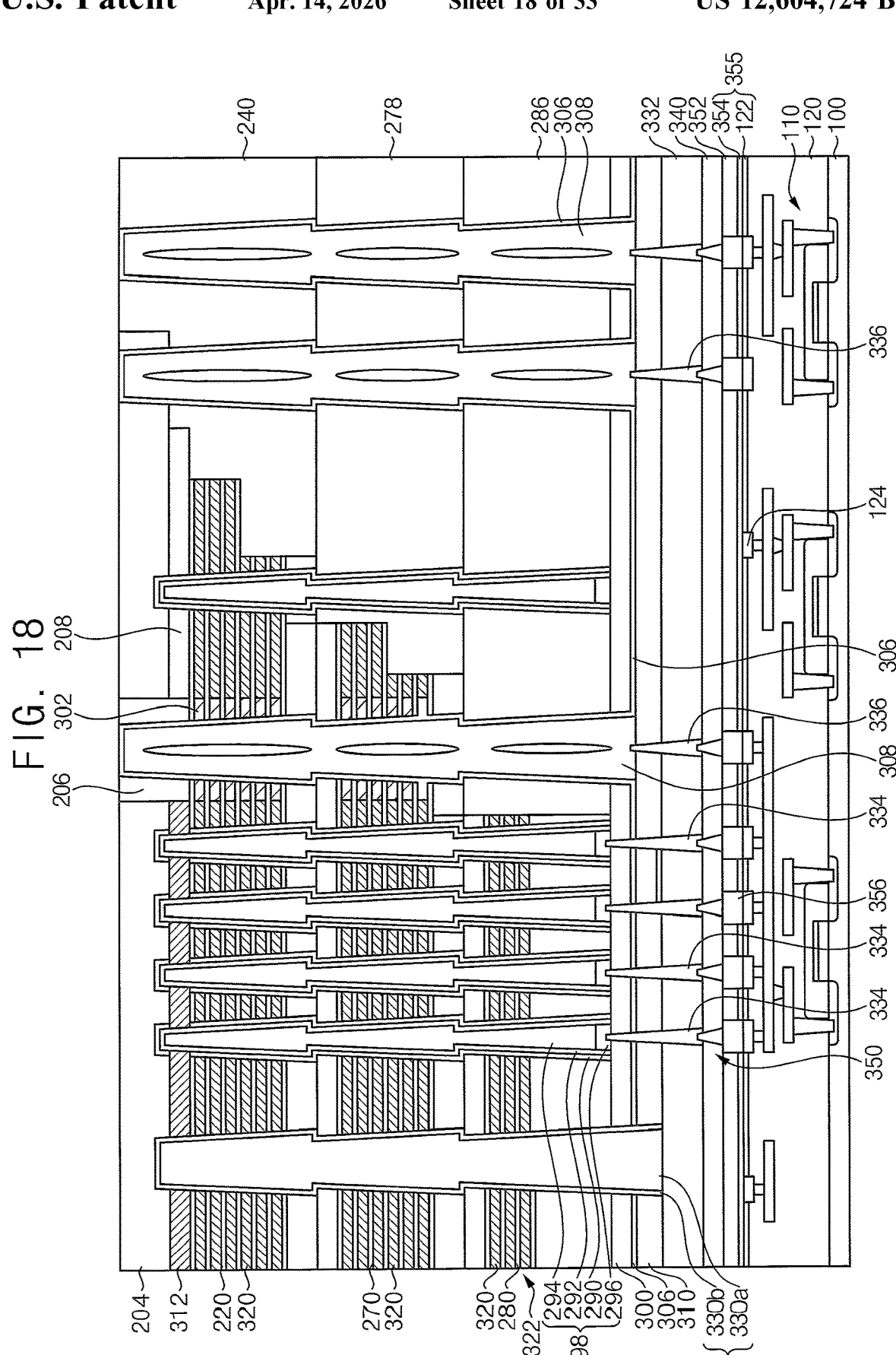

Referring to FIG. 18, the second substrate 200 may be removed. A process of removing the second substrate 200 may include a grinding process, a chemical mechanical polishing process, and an etching process.

According to the exemplary embodiment, most of the second substrate 200 may be removed through the grinding process, and the chemical mechanical polishing process may be subsequently performed. In addition, after the chemical mechanical polishing process is performed, the etching process may be performed to expose the lower etching stop layer 202. The etching process may include a wet or dry etching process.

Thereafter, the lower etching stop layer 202 may be removed. Therefore, the base pattern 204, the lower insulating pattern 206, and the third embedded sacrificial pattern 308 may be exposed through an uppermost portion disposed furthest from the first substrate 100 in the vertical direction.

Figure 19:
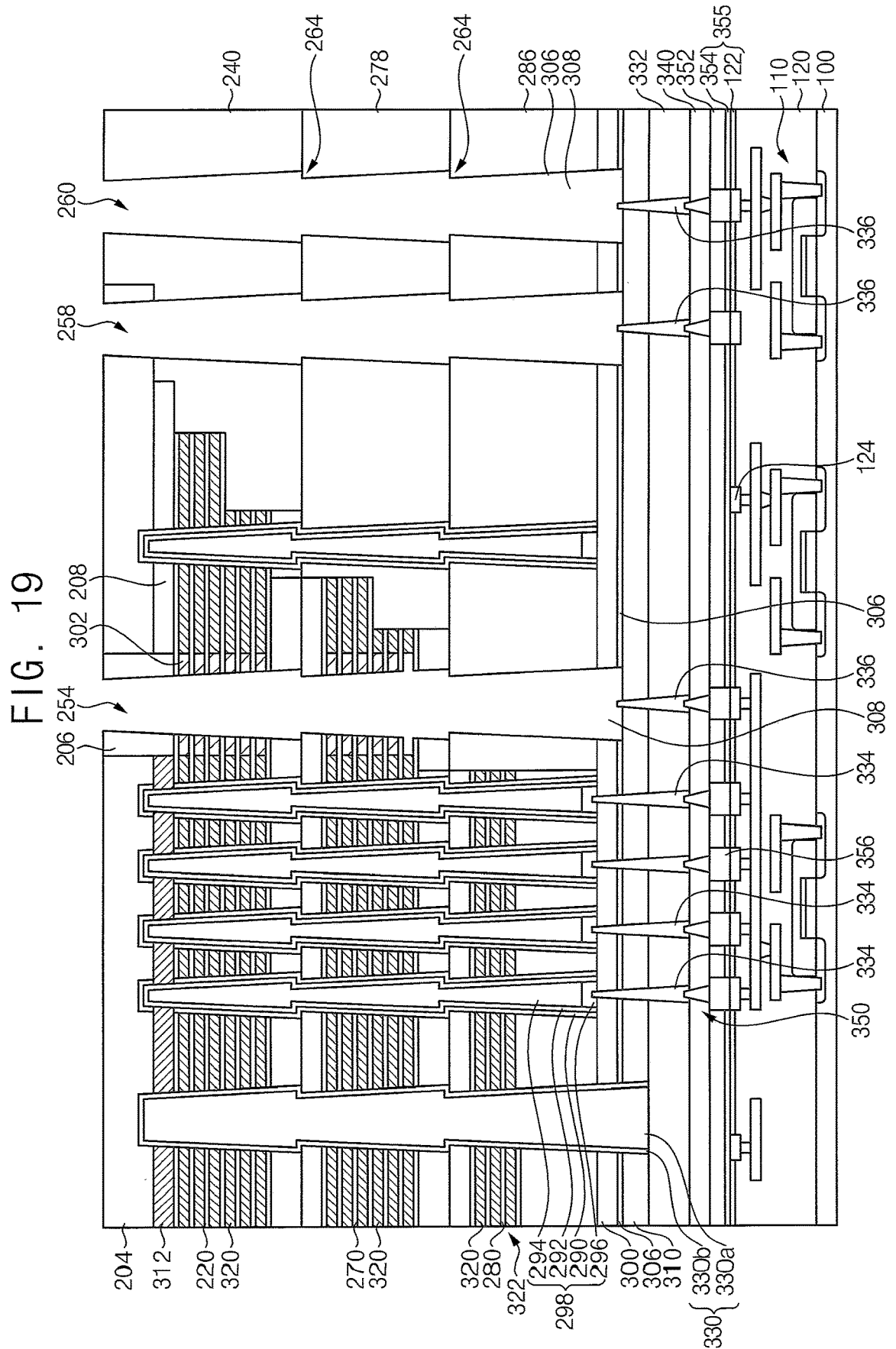

Referring to FIG. 19, the third embedded sacrificial pattern 308 and the first silicon oxide layer liner 306 may be removed. Therefore, the cell contact hole 254, the plate contact hole 258, and the through-hole 260 may be formed again. The top portions of the cell contact hole 254, the plate contact hole 258, and the through-hole 260 may be disposed on a same plane as the top surface of the base pattern 204. The bottom surfaces of the cell contact hole 254, the plate contact hole 258, and the through-hole 260 may be disposed on a same plane.

According to the exemplary embodiment, a top surface of the second contact plug 336 may protrude from the bottom surface of each of the cell contact hole 254, the plate contact hole 258, and the through-hole 260. In some exemplary embodiments, the top surface of the second contact plug 336 may be disposed at a same position as the bottom surface of each of the cell contact hole 254, the plate contact hole 258, and the through-hole 260.

Figure 20:
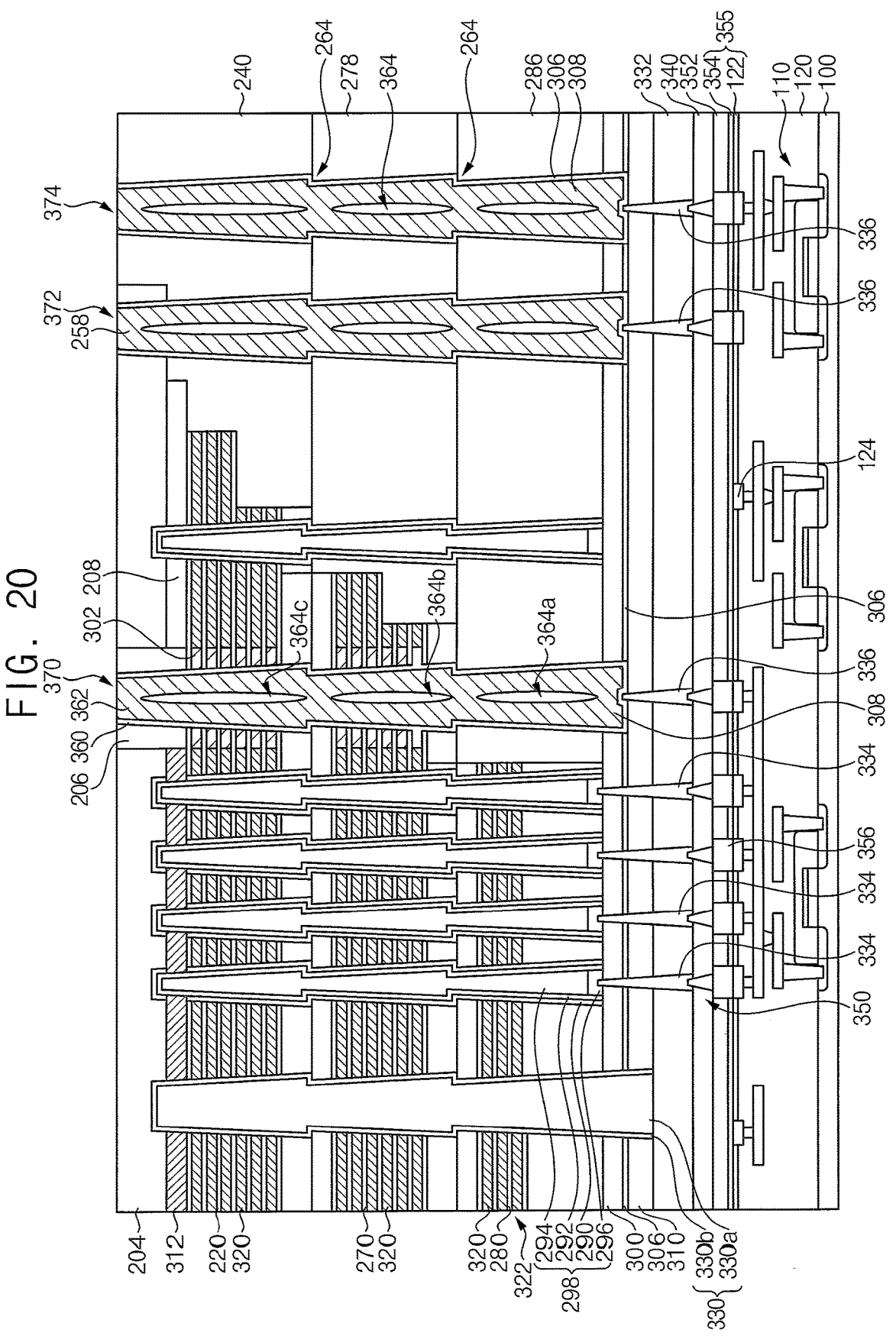

Referring to FIG. 20, a metal material may fill the cell contact hole 254, the second recess, the plate contact hole 258, and the through-hole 260. Therefore, a cell contact plug 370 may be formed inside the cell contact hole 254 and the second recess. The cell contact plug 370 may contact one gate electrode 320 exposed by the second recess. In addition, a plate contact plug 372 may be formed in the plate contact hole 258, and a through-plug 374 may be formed in the through-hole 260.

For example, a barrier metal layer may be formed on the surfaces of the cell contact hole 254, the second recess, the plate contact hole 258, and the through-hole 260, and on the base pattern 204, the lower insulating pattern 206, and the first interlayer insulating layer 240.

A metal layer may be formed on the barrier metal layer and may fill the cell contact hole 254, the second recess, the plate contact hole 258, and the through-hole 260.

The barrier metal layer may include, for example, titanium, titanium nitride, tantalum, tantalum nitride, and the like, and the metal layer may include tungsten. A deposition source gas in a process of forming the tungsten may include $WF_6$. The metal layer may be formed through an atomic layer deposition process or a chemical vapor deposition process.

Thereafter, the metal layer and the barrier metal layer may be planarized to expose the base pattern 204. Therefore, each of the cell contact plug 370, the plate contact plug 372, and the through-plug 374 may include a barrier metal pattern 360 and a metal pattern 362.

The barrier metal pattern 360 may make direct contact with the second contact plug 336 exposed through the bottom surfaces of the cell contact hole 254, the plate contact hole 258, and the through-hole 260. In addition, the barrier metal pattern might not be formed on the top portions of the cell contact hole 254, the plate contact hole 258, and the through-hole 260, which are substantially disposed on a same plane as the top surface of the base pattern 204.

Since an aspect ratio of each of the cell contact hole 254, the plate contact hole 258, and the through-hole 260 is large, and a sidewall of each of the cell contact hole 254, the plate contact hole 258, and the through-hole 260 includes the bent part 264, when the metal layer is formed inside the cell contact hole 254, the plate contact hole 258, and the through-hole 260, a seam 364 may be formed inside the metal layer. The metal patterns 362 formed inside the cell contact hole 254, the plate contact hole 258, and the through-hole 260 may have seams 364 having shapes that are similar to each other.

According to the exemplary embodiment, a number of seams 364 formed in the metal pattern formed inside each of the cell contact hole 254, the plate contact hole 258, and the through-hole 260 may be greater than a number of bent parts 264 included in each of the cell contact hole 254, the plate contact hole 258, and the through-hole 260 by 1.

A deposition gas may be introduced downward from inlet regions of the cell contact hole 254, the plate contact hole 258, and the through-hole 260 to form the metal layer, and a position of the seam 364 generated inside the cell contact hole 254, the plate contact hole 258, and the through-hole 260 may vary according to a direction in which the deposition gas is introduced.

Referring to the cell contact plug 370, first to third seams 364a, 364b and 364c may be formed in the first to third cell contact holes 254a, 254b, and 254c, respectively. A distance from the bent part 264 to a bottom surface of the seam disposed over the bent part 264 may be shorter than a distance from the bent part 264 to a top surface of the seam disposed under the bent part 264. For example, a distance from an uppermost bent part 264 to a bottom surface of the third seam 364c, which is an uppermost seam, may be shorter than a distance from the uppermost bent part 264 to a top surface of the second seam 364b.

In addition, a distance from a top surface of the third seam 364c disposed at an uppermost portion to a top surface of the cell contact plug 370 may be longer than a distance from the bottom surface of the third seam 364c to the uppermost bent part.

First to third seams may also be formed in each of the plate contact plug 372 and the through-plug 374 as described above.

As described above, a metal material deposition process for forming the cell contact plug 370, the plate contact plug 372, and the through-plug 374 may be performed after bonding the first substrate 100 and the second substrate 200 to each other. Therefore, the cell contact plug 370, the plate contact plug 372, and the through-plug 374 might not be affected by a bonding process of the first substrate 100 and the second substrate 200. Defects of the cell contact plug 370, the plate contact plug 372, and the through-plug 374 caused by the bonding process of the first substrate 100 and the second substrate 200 may be suppressed.

In a case where the cell contact plug 370, the plate contact plug 372, and the through-plug 374 are formed before bonding the first substrate 100 and the second substrate 200 to each other, when a bonding process including subsequent processes such as heat, compression, and grinding processes is performed, stress may be applied to the cell contact plug 370, the plate contact plug 372, and the through-plug 374. In addition, the cell contact plug 370 and the through-plug 374 may be consumed in a process of grinding the second substrate to remove the second substrate, so that characteristics of the cell contact plug 370 and the through-plug 374 may deteriorate. Further, during a subsequent process including the bonding process of the first substrate 100 and the second substrate 200, a gas (e.g., a fluorine gas) remaining in the cell contact plug 370, the plate contact plug 372, and the through-plug 374 may be diffused.

Figure 21:
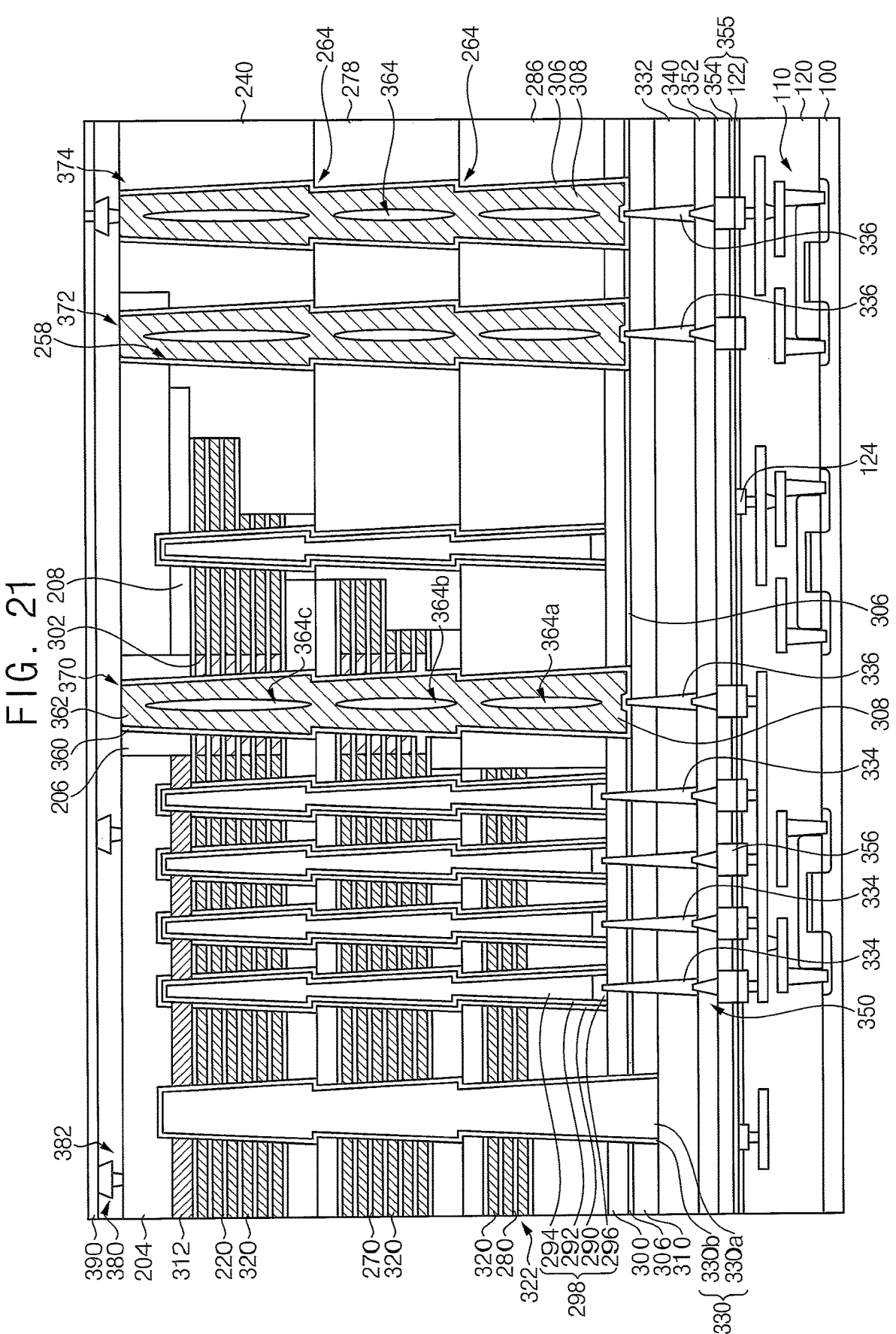

Referring to FIG. 21, a ninth interlayer insulating layer 380 may be formed on the cell contact plug 370, the plate contact plug 372, the through-plug 374, the base pattern 204, the lower insulating pattern 206, and the first interlayer insulating layer 240.

Upper wires 382 passing through the ninth interlayer insulating layer 380 to be connected to the cell contact plug 370, the base pattern 204, and the through-plug 374 may be formed. Thereafter, a protective layer 390 covering the ninth interlayer insulating layer 380 and the upper wires 382 may be formed. The protective layer 390 may include, for example, polyimide.

A bonding-type vertical semiconductor device may be manufactured by performing the above processes.

The bonding-type vertical semiconductor device manufactured through the processes described above may have the following structural characteristics.

The structural characteristics of the vertical semiconductor device will be described with reference to FIG. 21.

Referring again to FIG. 21, the bonding-type vertical semiconductor device may include a lower circuit pattern 110 disposed on a first substrate 100, and a lower interlayer insulating layer 120 covering the lower circuit pattern 110.

A first bonding layer 122 and a first bonding pattern 124 may be disposed on the lower interlayer insulating layer 120. The first bonding pattern 124 may include a metal. The first bonding pattern 124 may include, for example, copper or aluminum.

A cell stack structure, contact plugs, wires, interlayer insulating layers, a second bonding pattern, a second bonding layer, and the like for forming vertical memory cells may be formed on a base pattern 204 and a lower insulating pattern 206. The vertical semiconductor device may have a configuration in which the base pattern 204 and the lower insulating pattern 206 face upward so that a second bonding pattern 356 and a second bonding layer 354 are bonded to the first bonding pattern 124 and the first bonding layer 122, respectively.

Hereinafter, the vertical memory cells in a bonded state will be described. For example, in the following description, a region close to the first substrate 100 will be defined as a lower portion, and a region close to the base pattern 204 will be defined as an upper portion.

The first bonding layer 122 formed on the first substrate 100 may be bonded to the second bonding layer 354. The first bonding pattern 124 formed on the first substrate 100 may be bonded to the second bonding pattern 356 corresponding to the first bonding pattern 124. An eighth interlayer insulating layer 352 may be disposed between the second bonding patterns 356.

Interlayer insulating layers 300, 310, 332, and 340 may be disposed on the second bonding pattern 356 and the eighth interlayer insulating layer 352, and first wires 350 and first and second contact plugs 334 and 336 may be disposed inside the interlayer insulating layers 300, 310, 332, and 340. The first wires 350 may be electrically connected to the second bonding pattern 356. The first and second contact plugs 334 and 336 may be disposed on the first wires 350, and may be electrically connected to the first wires 350.

For example, a seventh interlayer insulating layer 340 may be disposed on the eighth interlayer insulating layer 352, and the first wires 350 may be disposed inside the seventh interlayer insulating layer 340. Sixth and fifth interlayer insulating layers 332 and 310 may be disposed on the seventh interlayer insulating layer 340, and the first and second contact plugs 334 and 336 may pass through the sixth and fifth interlayer insulating layers 332 and 310.

A fourth interlayer insulating layer 300 may be disposed on the fifth interlayer insulating layer 310.

A pattern structure 322 in which insulating patterns 220, 270, 280 and a gate electrode 320 are alternately and repeatedly stacked in the vertical direction may be disposed on the fourth interlayer insulating layer 300. The pattern structure 322 may extend in the first direction, and a plurality of pattern structures 322 may be spaced apart from each other. For example, a word line cut opening 252 may be disposed between the pattern structures 322.

An edge region of the pattern structure 322 may have a step shape in which a length gradually increases from a bottom to a top. For example, the edge region of the pattern structure 322 may have a shape of steps in which a top and a bottom are inverted.

A region in which the gate electrode 320 is formed may be replaced with a fourth insulating pattern 302 in a portion of the pattern structure 322 having a step shape. For example, the portion of the pattern structure 322 having the step shape may include a structure in which insulating patterns are stacked in the vertical direction.

The base pattern 204 and the lower insulating pattern 206 may be disposed on a top surface of the pattern structure 322. A ninth interlayer insulating layer 380 may be disposed on the base pattern 204, the lower insulating pattern 206, and a first interlayer insulating layer 240.

The pattern structure 322 may include a first pattern structure, a second pattern structure, and a third pattern structure, which are sequentially stacked in the downward direction from a bottom surface of the base pattern 204.

A region of the pattern structure 322 that does not have the step shape may correspond to a memory cell region A, and the edge region of the pattern structure 322 having the step shape may correspond to a cell extension region B. A region in which the pattern structure 322 is not formed may correspond to a through-wire region C.

The first interlayer insulating layer 240, a second interlayer insulating layer 278, and a third interlayer insulating layer 286, which cover sidewalls of the base pattern 204 and the pattern structure 322, are stacked in the downward direction from the bottom surface of the base pattern 204. The first interlayer insulating layer 240 may cover a sidewall of the first pattern structure, the second interlayer insulating layer 278 may cover a sidewall of the second pattern structure, and the third interlayer insulating layer 286 may cover a sidewall of the third pattern structure. The third interlayer insulating layer 286 may be formed on the fourth interlayer insulating layer 300.

The first to third interlayer insulating layers 240, 278, and 286 may include silicon oxide. The first to third interlayer insulating layers 240, 278, and 286 may be formed of substantially a same material.

A channel hole 250 may be formed through the pattern structure 322 in the memory cell region A and may extend to the base pattern 204. A channel structure 298 may be disposed inside the channel hole 250. The channel structure 298 may be formed inside the channel hole 250, and may include a first blocking dielectric layer pattern, a charge storage layer pattern, a tunnel insulating layer pattern, a channel 292, a first embedded insulating pattern 294, and a capping pattern 296. The channel structure 298 may extend to the base pattern 204, and may contact a bottom portion of the base pattern 204. The channel 292 in the channel structure 298 may be electrically connected to the base pattern 204.

A dummy hole 256 may be formed through the pattern structure 322 in the cell extension region B and may extend to the base pattern 204. A dummy structure may be disposed inside the dummy hole 256. The dummy structure may be formed inside the dummy hole 256, and may include a first blocking dielectric layer pattern, a charge storage layer pattern, a tunnel insulating layer pattern, a channel 292, a first embedded insulating pattern 294, and a capping pattern 296. The dummy structure may contact the bottom portion of the base pattern 204. The dummy structure may serve to support the pattern structure 322.

The word line cut opening 252 may be formed through the first to fifth interlayer insulating layers 240, 278, 286, 300, and 310 and the pattern structure 322 in the memory cell region A and the cell extension region B to extend to the base pattern 204. A second embedded insulating pattern 330 may be disposed inside the word line cut opening 252. The second embedded insulating pattern 330 may contact the bottom portion of the base pattern 204. According to an exemplary embodiment, the second embedded insulating pattern 330 may include a second silicon oxide layer liner 330a and an embedded oxide layer pattern 330b.

The word line cut opening 252 may extend in the first direction. Therefore, the second embedded insulating pattern 330 may be disposed between the pattern structures 322 arranged in the second direction so as to electrically separate the pattern structures 322 from each other.

A channel connection pattern 312 for connecting lower sidewalls of the channels 292 in the channel structure 298 may be disposed on the base pattern 204 to communicate with a lower sidewall of the word line cut opening 252.

A cell contact hole 254 may be formed through the pattern structure 322 and the lower insulating pattern 206 in the cell extension region B and the first to fourth interlayer insulating layers 240, 278, 286, and 300. The cell contact hole 254 may be formed through a region of the pattern structure 322 in which the fourth insulating pattern 302 is stacked. Only one uppermost gate electrode 320 may be exposed through a sidewall of the cell contact hole 254. A cell contact plug 370 may be disposed inside the cell contact hole 254. Therefore, the cell contact plug 370 may be electrically connected to the one gate electrode 320. The cell contact plug 370 may extend to the ninth interlayer insulating layer 380, and may contact the ninth interlayer insulating layer 380.

A plate contact hole 258 may be formed through the edge portion of the base pattern 204 in the through-wire region C and the first to fourth interlayer insulating layers 240, 278,

286, and 300. The base pattern 204 may be exposed through a sidewall of the plate contact hole 258. A plate contact plug 372 may be disposed inside the plate contact hole 258. The plate contact plug 372 may be electrically connected to the base pattern 204. The plate contact plug 372 may extend to the ninth interlayer insulating layer 380, and may contact the ninth interlayer insulating layer 380.

A through-hole 260 may be formed through the first to fourth interlayer insulating layers 240, 278, 286, and 300 in the through-wire region C. A through-plug 374 may be disposed inside the through-hole 260. The through-plug 374 may extend to the ninth interlayer insulating layer 380, and may contact the ninth interlayer insulating layer 380.

A plurality of bent parts 264 may be included in sidewalls of the channel hole 250, the word line cut opening 252, the cell contact hole 254, the dummy hole 256, the plate contact hole 258, and the through-hole 260. The bent parts 264 included in the channel hole 250, the word line cut opening 252, the cell contact hole 254, the dummy hole 256, the plate contact hole 258, and the through-hole 260 may be disposed on a same plane. The bent part 264 may be disposed on a same plane as an interface between the interlayer insulating layers covering a sidewall of the pattern structure 322. According to the exemplary embodiment, the bent parts may be disposed on a same plane as an interface between the first and second interlayer insulating layers 240 and 278, and on a same plane as an interface between the second and third interlayer insulating layers 278 and 286, respectively.

The cell contact plug 370, the plate contact plug 372, and the through-plug 374 may include a same metal material. Each of the cell contact plug 370, the plate contact plug 372, and the through-plug 374 may include a barrier metal pattern and a metal pattern. The barrier metal pattern 360 may include, for example, titanium, titanium nitride, tantalum, tantalum nitride, and the like, and the metal pattern 362 may include tungsten.

A seam may be included in the metal pattern 362. According to the exemplary embodiment, a number of seams formed in the metal pattern 362 formed inside each of the cell contact plug 370, the plate contact plug 372, and the through-plug 374 may be greater than a number of bent parts included in each of the cell contact hole 254, the plate contact hole 258 and the through-hole 260 by 1.

A first contact plug 334 may contact the capping pattern 296 of the channel structure 298. A second contact plug 336 may contact each of the cell contact plug 370, the plate contact plug 372, and the through-plug 374.

The cell contact hole 254, the plate contact hole 258, and the through-hole 260 may have a sidewall inclination so that an inner width may gradually increase from a top to a bottom, may have the inner width that decreases at the bent part 264, and may have the inner width that gradually increases from the bent part 264 to the bottom. Accordingly, the cell contact plug 370, the plate contact plug 372, and the through-plug 374 may have a sidewall inclination so that an inner width may gradually increase from a top to a bottom.

In addition, the channel hole 250, the word line cut opening 252, and the dummy hole 256 may have a sidewall inclination so that an inner width may gradually increase from a top to a bottom, may have the inner width that decreases at the bent part 264, and may have the inner width that gradually increases from the bent part 264 to the bottom. Accordingly, the channel structure 298, the second embedded insulating pattern 330, and the dummy structure may have a sidewall inclination so that an inner width may gradually increase from a top to a bottom.

Bottom surfaces of the cell contact plug 370, the plate contact plug 372, and the through-plug 374 may be disposed on a same plane.

The bottom surfaces of the cell contact plug 370, the plate contact plug 372, and the through-plug 374 may be lower than bottom surfaces of the channel structure 298 and the dummy structure. For example, the bottom surfaces of the cell contact plug 370, the plate contact plug 372, and the through-plug 374 may be closer to the first substrate 100 than the bottom surfaces of the channel structure 298 and the dummy structure.

The bottom surfaces of the cell contact plug 370, the plate contact plug 372, and the through-plug 374 may be higher than a bottom surface of the second embedded insulating pattern 330, with respect to a distance from the second substrate. Therefore, the bottom surfaces of the cell contact plug 370, the plate contact plug 372, and the through-plug 374 may be disposed on a plane between the bottom surfaces of the channel structure 298 and the dummy structure and the bottom surface of the second embedded insulating pattern 330.

The barrier metal pattern 360 included in the cell contact plug 370, the plate contact plug 372, and the through-plug 374 may make direct contact with the fifth interlayer insulating layer 310 and the second contact plug 336 exposed through the bottom surfaces of the cell contact hole 254, the plate contact hole 258, and the through-hole 260. The barrier metal pattern might not be formed on uppermost surfaces of the cell contact plug 370, the plate contact plug 372, and the through-plug 374.

In the cell contact plug 370, the plate contact plug 372, and the through-plug 374, a distance from the bent part 264 to a bottom surface of a seam disposed over the bent part 264 may be shorter than a distance from the bent part 264 to a top surface of a seam disposed under the bent part 264. For example, a distance from an uppermost bent part 264 to a bottom surface of a third seam 364c, which is an uppermost seam, may be shorter than a distance from the uppermost bent part 264 to a top surface of a second seam 364b.

In addition, a distance from a top surface of the third seam 364c disposed at an uppermost portion to a top surface of each of the cell contact plug 370, the plate contact plug 372, and the through-plug 374 may be longer than a distance from the bottom surface of the third seam 364c to the uppermost bent part 264.

The ninth interlayer insulating layer 380 may cover the cell contact plug 370, the plate contact plug 372, and the through-plug 374.

Upper wires 382 may pass through the ninth interlayer insulating layer 380 to be connected to the cell contact plug 370, the base pattern 204, and the through-plug 374. A protective layer 390 may cover the ninth interlayer insulating layer 380 and the upper wires 382.

FIGS. 22 to 25 are cross-sectional views illustrating a method of manufacturing a vertical semiconductor device according to exemplary embodiments.

A method of manufacturing a vertical semiconductor device that will be described below may be the same as the method of manufacturing the vertical semiconductor device described with reference to FIGS. 4 to 21 except for the inclusion of some additional processes, as are described below.

First, the structure shown in FIG. 18 may be formed by performing the same processes as described with reference to FIGS. 4 to 18.

Figure 22:
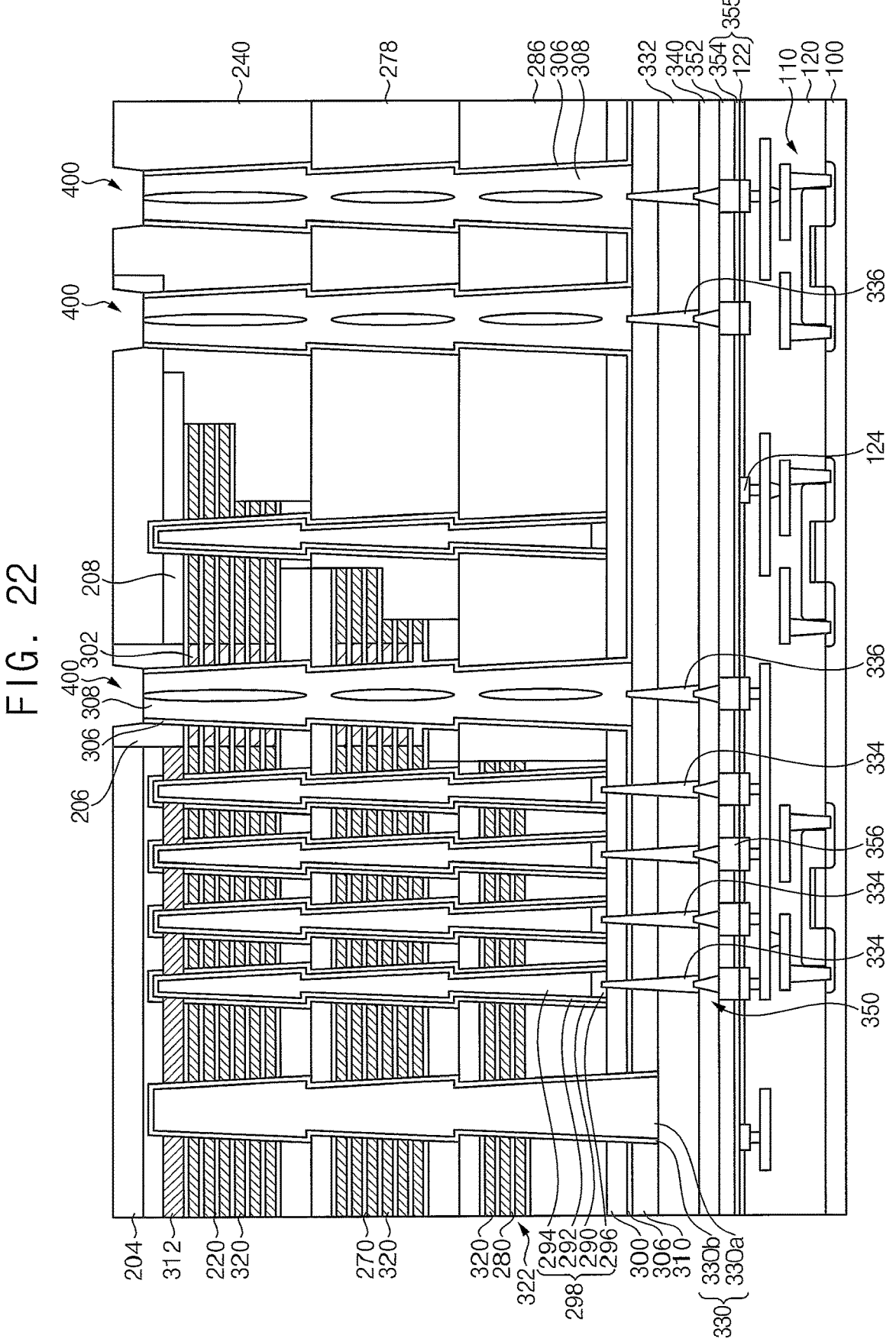
FIGS. 22 to 25 are cross-sectional views illustrating a method of manufacturing a vertical semiconductor device according to exemplary embodiments.

Referring to FIG. 22, an etching mask pattern that exposes the cell contact hole 254, the plate contact hole 258, the through-hole 260, and a region adjacent thereto may be formed. A first silicon oxide layer liner 306, a third embedded sacrificial pattern 308, the lower insulating pattern 206, and the base pattern 204 in an exposed region may be partially etched by using the etching mask pattern to form an upper opening 400. The upper opening 400 may have a sidewall inclination so that an upper width may be wider than a lower width.

Figure 23:
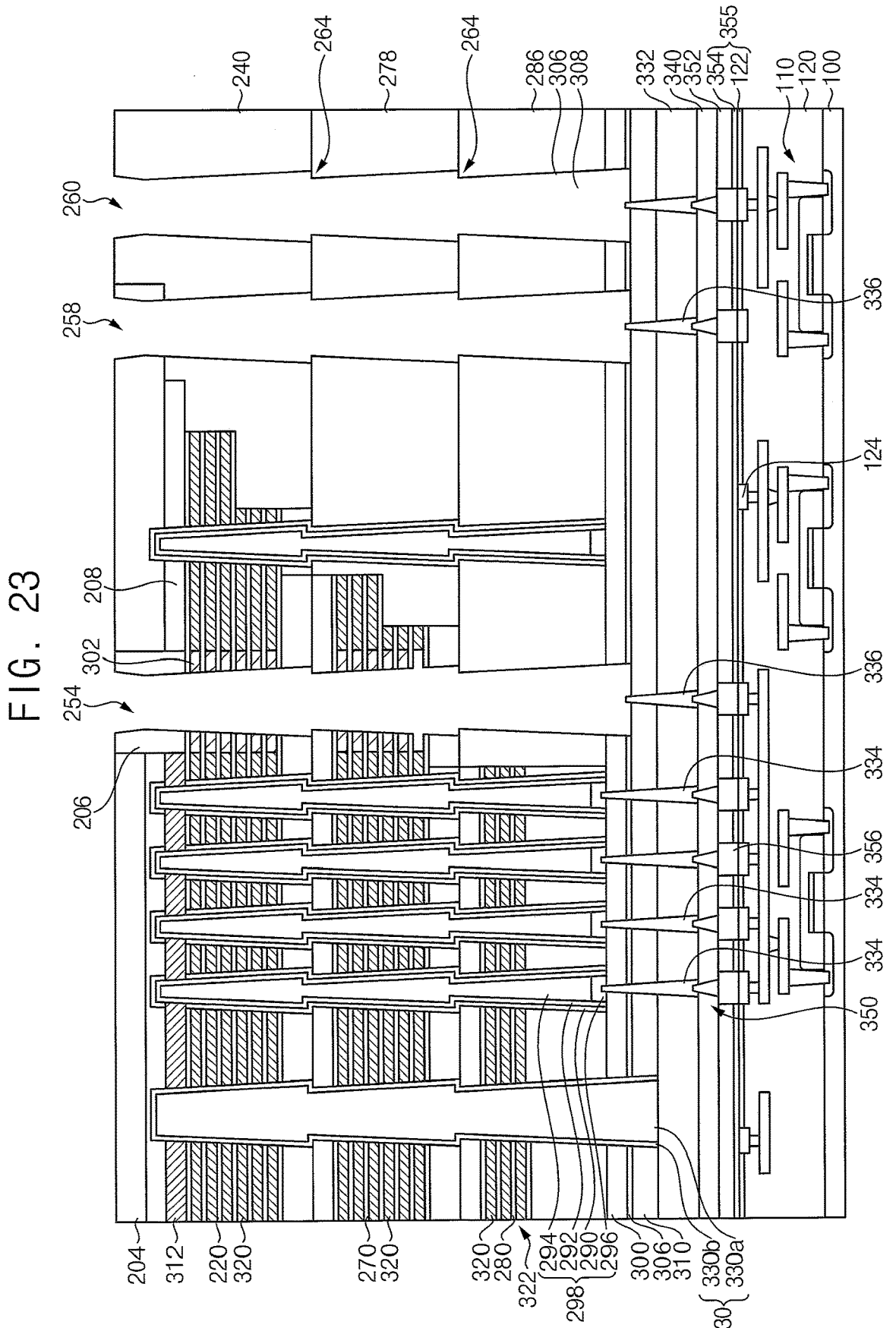

Referring to FIG. 23, the third embedded sacrificial pattern 308 and the first silicon oxide layer liner 306 formed under the upper opening 400 may be removed. Therefore, the cell contact hole 254, the plate contact hole 258, and the through-hole 260 having an inlet region expanded by the upper opening 400 may be formed.

Figure 24:
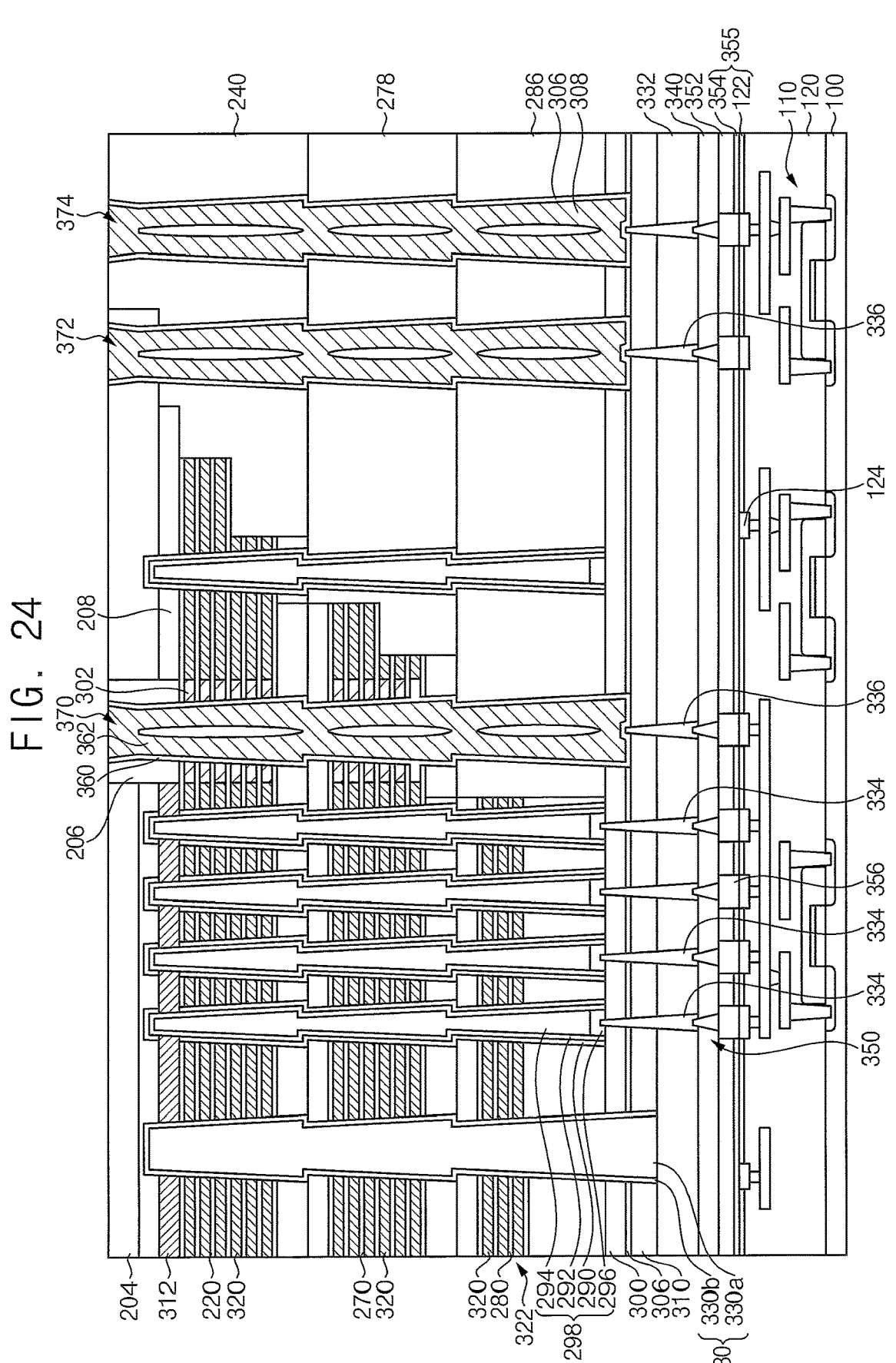

Referring to FIG. 24, a metal material may fill the cell contact hole 254, the second recess, the plate contact hole 258, and the through-hole 260. Therefore, a cell contact plug 370 may be formed inside the cell contact hole 254 and the second recess. In addition, a plate contact plug 372 may be formed in the plate contact hole 258, and a through-plug 374 may be formed in the through-hole 260.

For example, a barrier metal layer may be formed on surfaces of the cell contact hole 254, the second recess, the plate contact hole 258, and the through-hole 260, and on the base pattern 204, the lower insulating pattern 206, and the first interlayer insulating layer 240.

A metal layer may be formed on the barrier metal layer and may fill the cell contact hole 254, the second recess, the plate contact hole 258, and the through-hole 260.

When the barrier metal layer and the metal layer are formed, since the inlet regions of the cell contact hole 254, the plate contact hole 258, and the through-hole 260 are expanded, deposition gases may be easily introduced into the cell contact hole 254, the plate contact hole 258, and the through-hole 260. Therefore, the barrier metal layer and the metal layer may be more easily formed inside the cell contact hole 254, the plate contact hole 258, and the through-hole 260.

Thereafter, the metal layer and the barrier metal layer may be planarized to expose the base pattern 204. Therefore, each of the cell contact plug 370, the plate contact plug 372, and the through-plug 374 may include a barrier metal pattern 360 and a metal pattern 362.

Subsequently, the vertical semiconductor device shown in FIG. 25 may be formed by performing the same process as described with reference to FIG. 21.

The structural characteristics of the vertical semiconductor device will be described with reference to FIG. 25.

Figure 25:
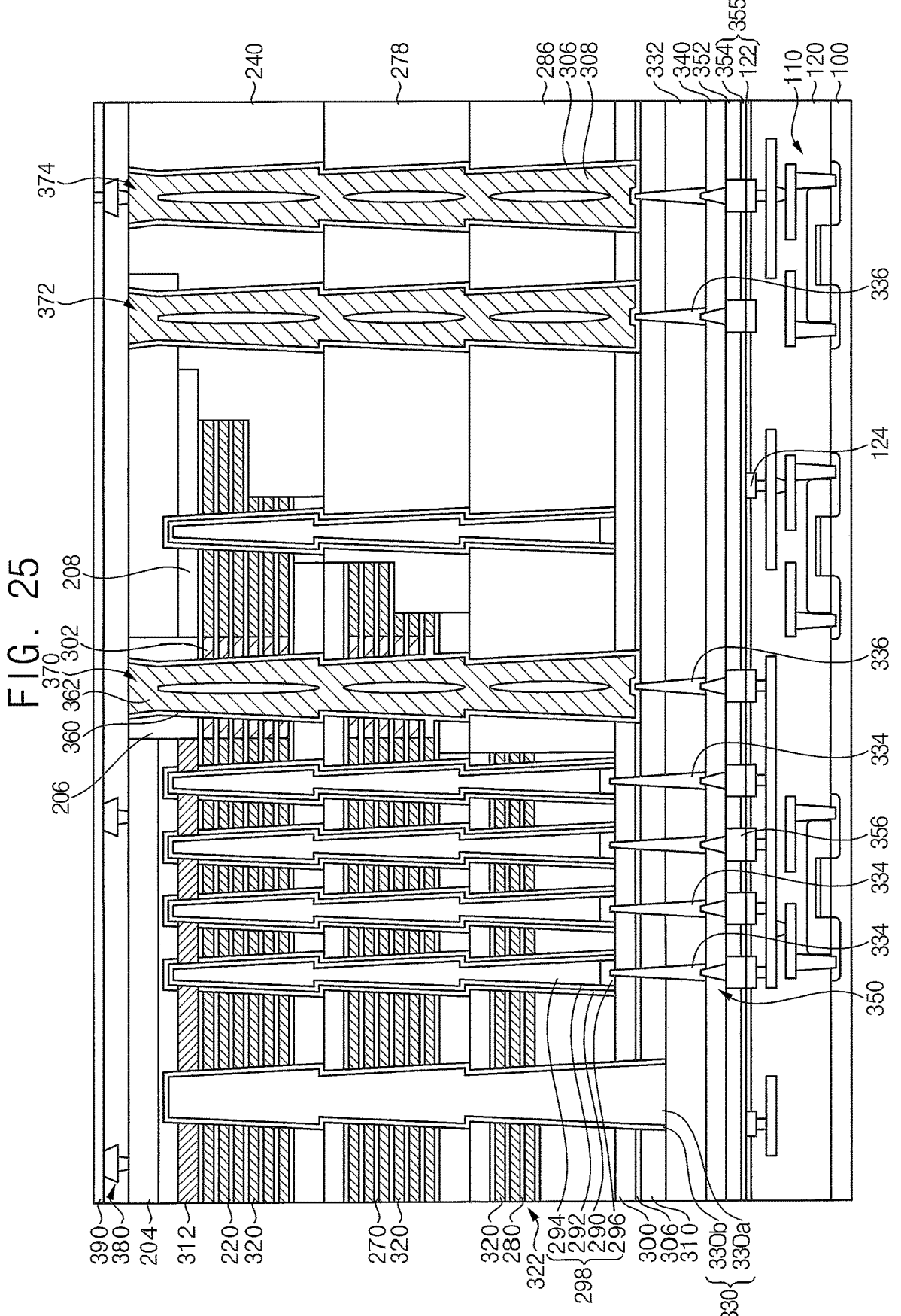

Referring to FIG. 25, according to the semiconductor device, an uppermost portion of the cell contact plug 370, the plate contact plug 372, and the through-plug 374 may have a sidewall inclination so that an inner width may gradually decrease from a top to a bottom.

A portion formed directly under the uppermost portion of the cell contact plug 370, the plate contact plug 372, and the through-plug 374 may have a sidewall inclination so that an inner width may gradually increase toward a bottom, may have the inner width that decreases at the bent part 264, and may have the inner width that gradually increases from the bent part 264 to the bottom.

Figure 26:
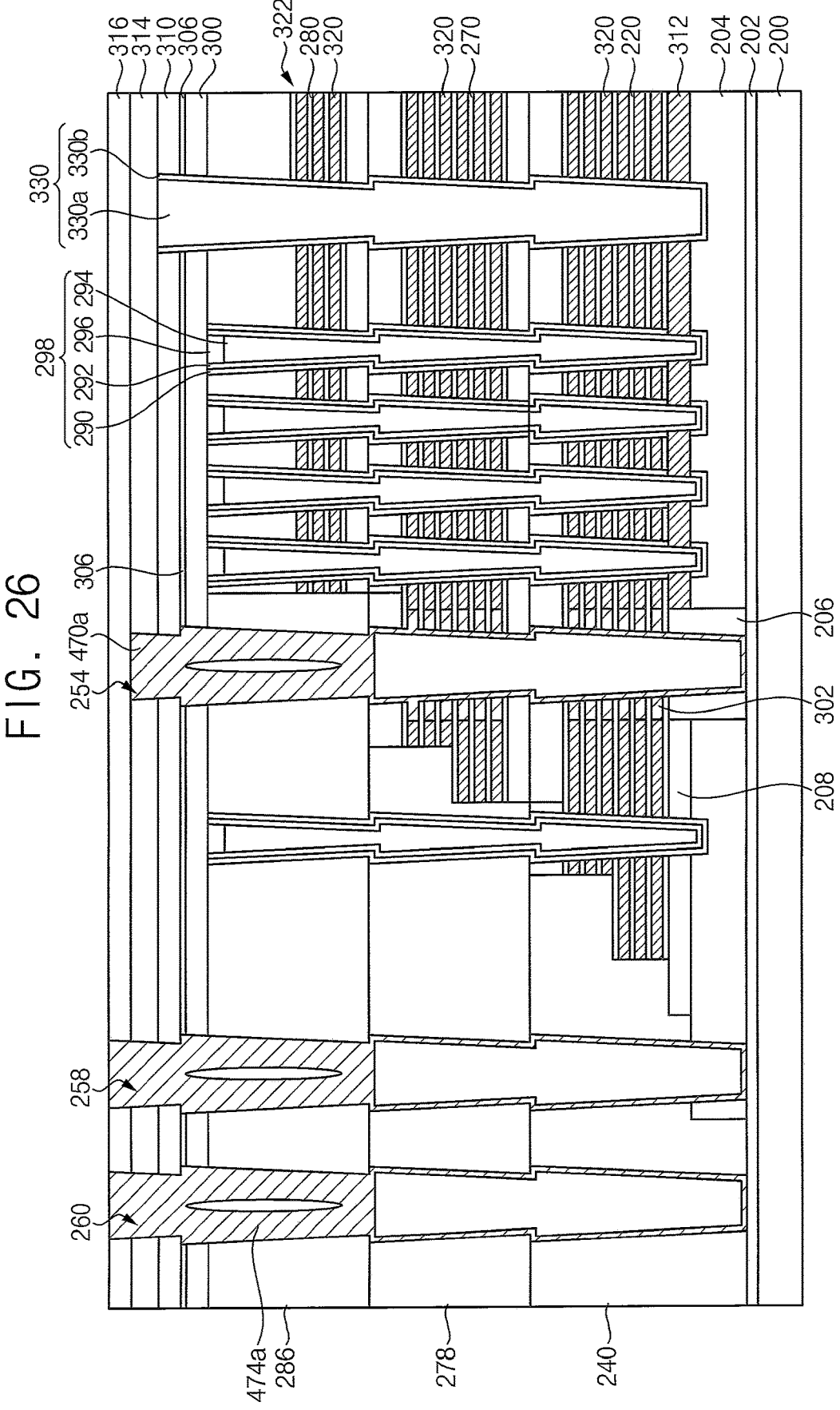
Figure 28:
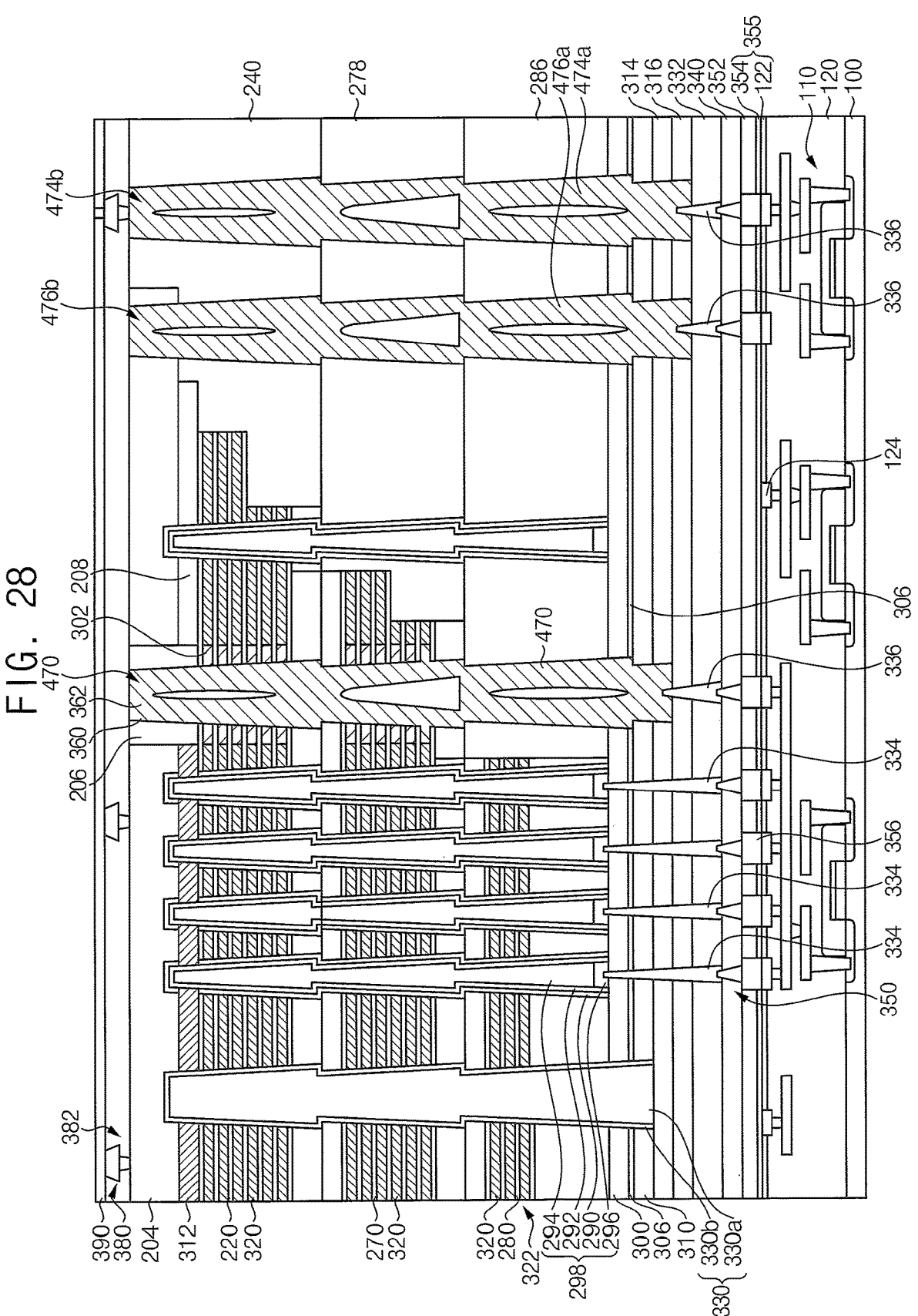

FIGS. 26 to 28 are cross-sectional views illustrating a method of manufacturing a vertical semiconductor device according to exemplary embodiments.

A method of manufacturing a vertical semiconductor device that will be described below may be the same as the method of manufacturing the vertical semiconductor device described with reference to FIGS. 4 to 21 except for some processes, which will be described.

First, the structure shown in FIG. 15 may be formed by performing the same processes as described with reference to FIGS. 4 to 15.

Referring to FIG. 26, a first additional interlayer insulating layer 314 may be formed on the fifth interlayer insulating layer 310 and the second embedded insulating pattern 330. The first additional interlayer insulating layer 314 may include silicon oxide.

The fourth and fifth interlayer insulating layers 300 and 310 and the first additional interlayer insulating layer 314 formed on the cell contact hole 254 and the through-hole 260 may be etched to form a first upper opening. Thereafter, the first sacrificial pattern structure 297 formed inside the cell contact hole 254 and the through-hole 260 may be removed. Therefore, the cell contact hole 254 and the through-hole 260 communicating with the first upper opening may be formed again.

A first metal layer may be formed inside the cell contact hole 254, the second recess, and the through-hole 260.

The first metal layer may include tungsten. A deposition source gas in a process of forming the tungsten may include $WF_6$. The first metal layer may be formed through an atomic layer deposition process or a chemical vapor deposition process.

The first metal layer may be planarized to expose the first additional interlayer insulating layer 314. Therefore, a first cell contact plug 470a may be formed inside the cell contact hole 254 and the second recess. In addition, a first through-plug 474a may be formed inside the through-hole 260.

The first cell contact plug 470a and the first through-plug 474a may mainly fill only upper portions of the cell contact hole 254 and the through-hole 260, respectively, and may rarely fill lower portions of the cell contact hole 254 and the through-hole 260.

Next, a second additional interlayer insulating layer 316 may be formed on the first additional interlayer insulating layer 314, the first cell contact plug 470a, and the first through-plug 474a. The fourth and fifth interlayer insulating layers 300 and 310 and the first and second additional interlayer insulating layers 314 and 316 formed on the plate contact hole 258 may be etched to form a second upper opening. Thereafter, the first sacrificial pattern structure 297 formed inside the plate contact hole 258 may be removed. Therefore, the plate contact hole 258 may be formed again.

A second metal layer may be formed inside the plate contact hole 258.

The second metal layer may include tungsten. A deposition source gas in a process of forming the tungsten may include $WF_6$. The second metal layer may be formed through an atomic layer deposition process or a chemical vapor deposition process.

The second metal layer may be planarized to expose the second additional interlayer insulating layer 316. Therefore, the first plate contact plug 476a is formed in the plate contact hole 258.

As described above, a first metal layer formation process for forming the first cell contact plug 470a and the first through-plug 474a and a second metal layer formation process for forming the first plate contact plug 476a may be performed by mutually different deposition processes. In some exemplary embodiments, the first and second metal layer formation processes may be performed through one metal layer deposition process.

Referring to FIG. 27, the same processes as described with reference to FIGS. 16 to 18 may be performed on the second additional interlayer insulating layer 316 and the first plate contact plug 476a.

Therefore, the base pattern 204 and the lower insulating pattern 206 may be exposed through an uppermost portion disposed furthest from the first substrate 100 in the vertical direction. In addition, top portions of the cell contact hole 254, the through-hole, and the plate contact hole 258 may be exposed.

Referring to FIG. 28, a fourth metal layer may be formed inside the cell contact hole 254, the plate contact hole 258, and the through-hole 260. The fourth metal layer may include tungsten. A deposition source gas in a process of forming the tungsten may include $WF_6$. The fourth metal layer may be formed through an atomic layer deposition process or a chemical vapor deposition process.

The fourth metal layer may be planarized to expose a top surface of the base pattern 204. Therefore, a second cell contact plug 470b, a second plate contact plug 476b, and a second through-plug 474b may be formed inside the cell contact hole 254, the plate contact hole 258, and the through-hole 260, respectively.

As described above, the first cell contact plug 470a, the first plate contact plug 476a, and the first through-plug 474a formed before bonding the first and second substrates to each other, and the second cell contact plug 470b, the second plate contact plug 476b, and the second through-plug 474b formed after bonding the first and second substrates 100 and 200 to each other may be included in the cell contact hole 254, the plate contact hole 258, and the through-hole 260, respectively.

Since the contact plugs are formed inside the cell contact hole 254, the plate contact hole 258, and the through-hole 260 through two deposition processes, respectively, the cell contact hole 254, the plate contact hole 258, and the through-hole 260 may be easily filled with the metal layers in the contact plugs. Therefore, a volume of a filling metal in each of the contact plugs may increase, and a resistance of each of the contact plugs may decrease.

Subsequently, the semiconductor device shown in FIG. 28 may be formed by performing the same process described with reference to FIG. 17.

Figure 29:
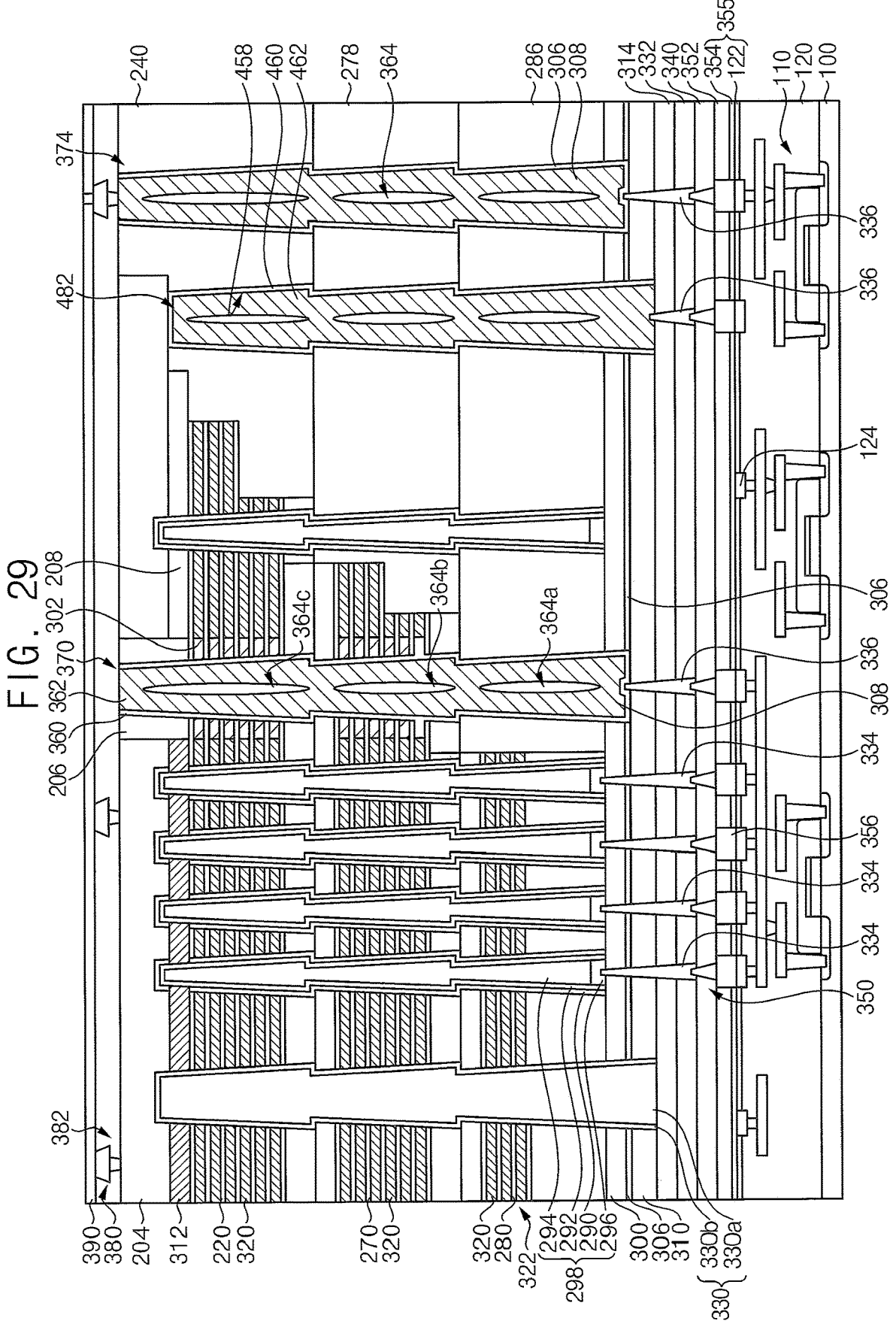
FIG. 29 is a cross-sectional view showing a vertical semiconductor device according to exemplary embodiments.

FIG. 29 is a cross-sectional view showing a vertical semiconductor device according to exemplary embodiments.

A vertical semiconductor device shown in FIG. 29 may be the same as the vertical semiconductor device shown in FIG. 21 except for a shape of the plate contact plug. Therefore, the shape of the plate contact plug will be mainly described.

Referring to FIG. 29, according to a bonding-type vertical semiconductor device, a plate contact plug 482 may contact an edge surface (i.e., a bottom surface) of the base pattern 204. For example, the plate contact plug 482 might not pass through the base pattern 204.

The plate contact plug 482 may include a metal material. The metal material may include tungsten.

According to an exemplary embodiment, the plate contact plug 482 may include a first barrier metal pattern 460 and a first metal pattern 462. The first barrier metal pattern 460 may be formed along a sidewall of the plate contact hole 458 and a surface of the base pattern 204.

According to the exemplary embodiment, a bottom surface of the plate contact plug 482 may be disposed at a level lower than a bottom surface of the second embedded insulating pattern 330.

The bottom surface of the plate contact plug 482 and bottom surfaces of the through-plug 374 and the cell contact plug 370 may be disposed on mutually different planes. The bottom surface of the plate contact plug 482 may be disposed at a level lower than the bottom surfaces of the through-plug 374 and the cell contact plug 370.

Figure 30:
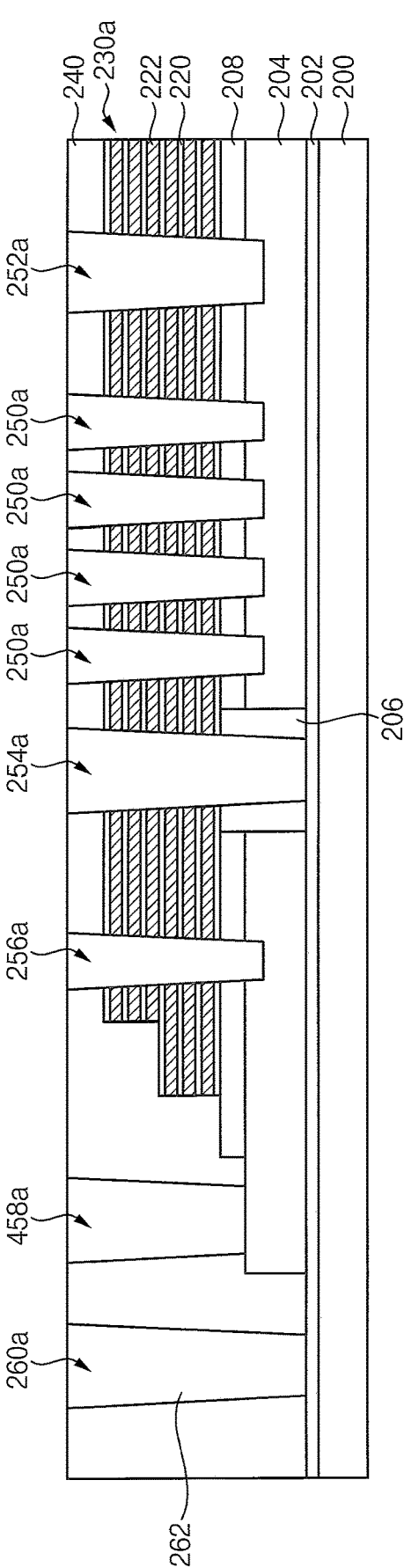
FIGS. 30 and 31 are cross-sectional views illustrating a method of manufacturing a vertical semiconductor device according to exemplary embodiments.
Figure 31:
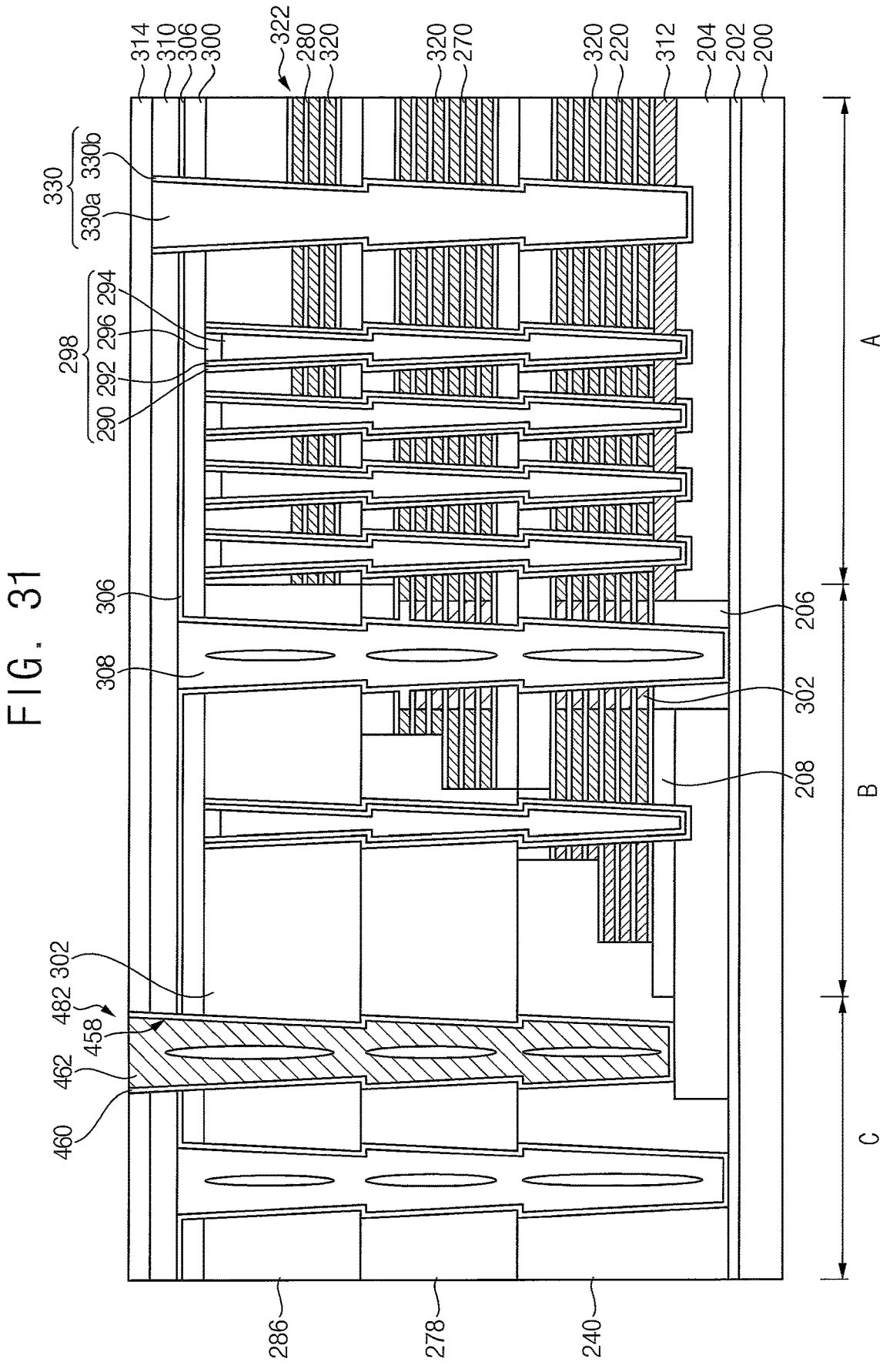

FIGS. 30 and 31 are cross-sectional views illustrating a method of manufacturing a vertical semiconductor device according to exemplary embodiments.

A method of manufacturing a vertical semiconductor device that will be described below may be the same as the method of manufacturing the vertical semiconductor device described with reference to FIGS. 4 to 21 except for some processes, which will be described.

Referring to FIG. 30, first, the same process as described with reference to FIG. 4 may be performed.

Thereafter, the process described with reference to FIG. 5 may be performed to form the first interlayer insulating layer 240, the first mold structure 230a, the support layer pattern, the lower sacrificial structure 208, and the base pattern 204 on the second substrate 200.

The first interlayer insulating layer 240, the first mold structure 230a, the support layer pattern, and the lower sacrificial structure 208 may be etched to form holes and trenches at respective positions. For example, through the above process, a first channel hole 250a, a first word line cut opening 252a, a first cell contact hole 254a, a first dummy hole 256a, a first plate contact hole 458a, and a first through-hole 260a may be formed.

The first channel hole 250a, the first word line cut opening 252a, the first cell contact hole 254a, the first dummy hole 256a, and the first through-hole 260a may be the same as the first channel hole 250a, the first word line cut opening 252a, the first cell contact hole 254a, the first dummy hole 256a, and the first through-hole 260a described with reference to FIG. 5. However, the first plate contact hole 458a may be formed through the first interlayer insulating layer 240 on the through-wire region C, and may have a bottom surface through which the top surface of the base pattern 204 is exposed. For example, the first plate contact hole 458a might not be formed through the base pattern 204.

Thereafter, the same processes as described with reference to FIGS. 4 to 15 may be performed.

Referring to FIG. 31, a first additional interlayer insulating layer 314 may be formed on the fifth interlayer insulating layer 310 and the second embedded insulating pattern 330. The first additional interlayer insulating layer 314 may include silicon oxide.

The fourth and fifth interlayer insulating layers 300 and 310 and the first additional interlayer insulating layer 314 formed on the plate contact hole 458 may be etched to form a first upper opening. Thereafter, the first sacrificial pattern structure 297 formed in the plate contact hole 458 may be removed. Therefore, the plate contact hole 458 communicating with the first upper opening may be formed.

A plate contact plug 482 may be formed inside the plate contact hole 458. The plate contact plug 482 may include tungsten.

According to an exemplary embodiment, a first barrier metal layer and a first metal layer may be formed in the plate contact hole 458, and the first barrier metal layer and the first metal layer may be planarized to expose the first additional interlayer insulating layer 314. Therefore, the plate contact plug 482 may include a first barrier metal pattern 460 and a first metal pattern 462.

As described above, the plate contact plug 482 may be formed first before bonding the second substrate 200 to the first substrate 100.

Thereafter, substantially the same processes as described with reference to FIGS. 16 to 21 may be performed. However, since the plate contact plug 482 has already been formed, only the cell contact plug 370 and the through-plug 374 may be formed through the processes of FIGS. 15 and 16.

Figure 32:
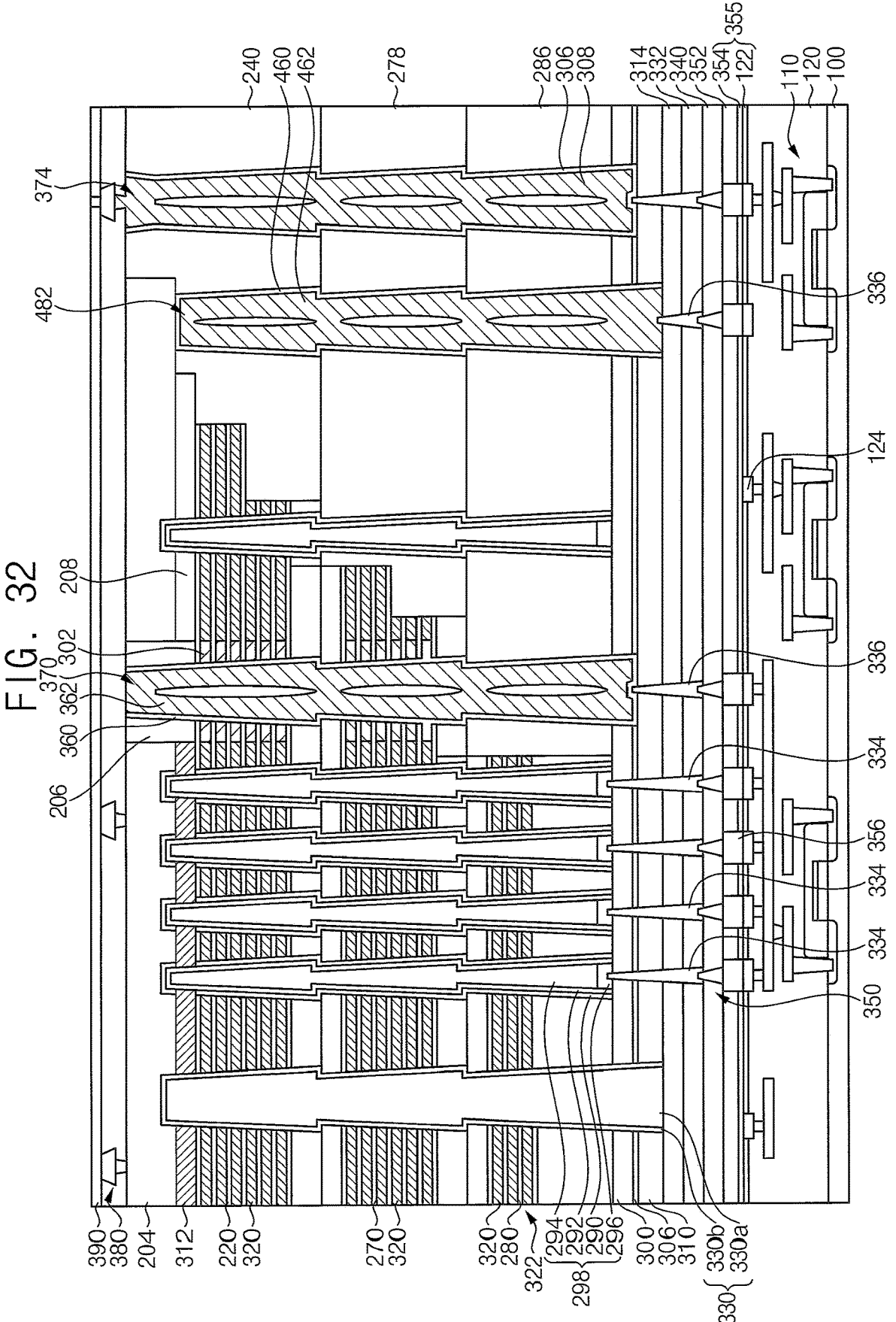
FIG. 32 is a cross-sectional view showing a vertical semiconductor device according to exemplary embodiments.

FIG. 32 is a cross-sectional view showing a vertical semiconductor device according to exemplary embodiments.

A vertical semiconductor device shown in FIG. 32 may be the same as the vertical semiconductor device shown in FIG. 25 except for a shape of the plate contact plug.

Referring to FIG. 32, the plate contact plug 482 may be the same as the plate contact plug shown in FIG. 29. The plate contact plug 482 may contact a bottom surface of an edge of the base pattern 204. For example, the plate contact plug might not pass through the base pattern 204.

Figure 33:
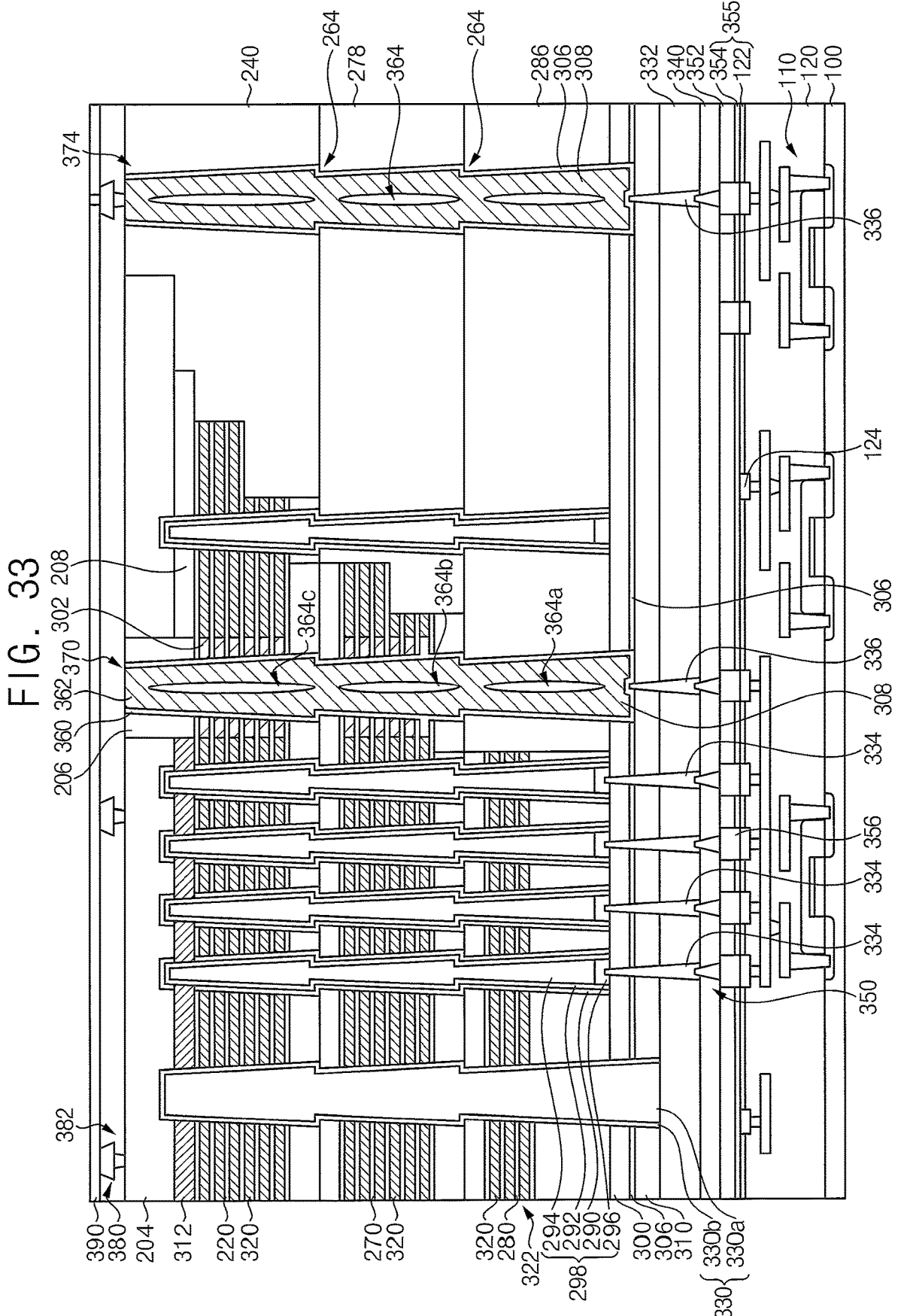
FIG. 33 is a cross-sectional view showing a vertical semiconductor device according to exemplary embodiments.

FIG. 33 is a cross-sectional view showing a vertical semiconductor device according to exemplary embodiments.

A vertical semiconductor device shown in FIG. 33 may be the same as the vertical semiconductor device shown in FIG. 21 except that a plate contact plug is not included. The plate contact plug might not be included, and the through-plug 374 and the base pattern 204 may be electrically connected to each other through the upper wires 382.

A process of manufacturing the vertical semiconductor device shown in FIG. 33 may be similar to the process of manufacturing the vertical semiconductor device described with reference to FIGS. 4 to 21. However, a process of forming a plate contact hole might not be performed in each step.

In some exemplary embodiments, a plate contact plug might not be included in the vertical semiconductor device shown in FIG. 25.

In some exemplary embodiments, a plate contact plug might not be included in the vertical semiconductor device shown in FIG. 29.

Although exemplary embodiments of the present disclosure have been described above, it will be understood by those of ordinary skill in the art that various changes and modifications can be made to the present disclosure without departing from the idea and scope of the present disclosure as set forth in the appended claims.

What is claimed is:

1. A vertical semiconductor device, comprising:
lower circuit patterns disposed on a first substrate;
a bonding layer disposed on the lower circuit patterns;
a wire disposed on the bonding layer;
pattern structures disposed on the wire, each of the pattern structures including insulating patterns and gate electrodes, which are alternately stacked on a top surface of the first substrate in a vertical direction, the pattern structures having an edge region having a step shape in which a length gradually increases from a bottom to a top, and extending in a first direction that is parallel to the top surface of the first substrate;
an embedded insulating pattern disposed inside a trench that is disposed between the pattern structures, and extending in the first direction;
a base pattern disposed on the pattern structure;
an upper insulating layer disposed on the base pattern;

a channel structure disposed inside a channel hole formed through the pattern structure, and extending to the base pattern;

a cell contact plug disposed inside a cell contact hole formed through a step-shaped region of the pattern structure, extending to the upper insulating layer, and electrically connected to one gate electrode in the pattern structure; and a through-plug disposed inside a through-hole formed through an outer side of the base pattern and extending to the upper insulating layer, wherein each of bottom surfaces of the cell contact plug and the through-plug is disposed at a level higher than a bottom surface of the embedded insulating pattern.

2. The vertical semiconductor device of claim 1, wherein each of the trench, the channel hole, the cell contact hole, and the through-hole has a sidewall inclined to have a width that gradually widens from a bottom to a top, and wherein a sidewall of each of the trench, the channel hole, the cell contact hole, and the through-hole has a bent part.

3. The vertical semiconductor device of claim 2, wherein the bent parts of the trench, the channel hole, the cell contact hole, and the through-hole are disposed on a same plane.

4. The vertical semiconductor device of claim 1, wherein the cell contact plug and the through-plug include a same metal pattern, and wherein a seam is included inside the metal pattern.

5. The vertical semiconductor device of claim 1, wherein each of the cell contact plug and the through-plug includes a barrier metal pattern and a metal pattern, and wherein the barrier metal pattern is disposed along sidewalls and bottom surfaces of the cell contact hole and the through-hole.

6. The vertical semiconductor device of claim 1, wherein the wire includes a contact plug, and wherein a barrier metal pattern included in each of the cell contact plug and the through-plug makes direct contact with the contact plug.

7. The vertical semiconductor device of claim 1, further comprising a plate contact plug disposed inside a plate contact hole formed through an outer side of the pattern structure, and electrically connected to the base pattern.

8. The vertical semiconductor device of claim 7, wherein bottom surfaces of the cell contact plug, the through-plug, and the plate contact plug are disposed on a same plane.

9. The vertical semiconductor device of claim 8, wherein the bottom surfaces of the cell contact plug, the through-plug, and the plate contact plug are disposed on a plane between a bottom surface of the channel structure and the bottom surface of the embedded insulating pattern.

10. The vertical semiconductor device of claim 7, wherein the plate contact plug passes through the base pattern and contacts the upper insulating layer.

11. The vertical semiconductor device of claim 7, wherein the plate contact plug contacts a bottom surface of the base pattern without passing through the base pattern.

12. The vertical semiconductor device of claim 1, wherein each of uppermost portions of the cell contact plug and the through-plug has an inclination so that a width gradually decreases from a top to a bottom.

13. The vertical semiconductor device of claim 1, further comprising a dummy structure passing through the step-shaped region of the pattern structure and extending to a bottom surface of the base pattern.

14. A vertical semiconductor device, comprising:

lower circuit patterns disposed on a first substrate;

a bonding layer disposed on the lower circuit patterns;

a wire disposed on the bonding layer;

pattern structures disposed on the wire, each of the pattern structures including insulating patterns and gate electrodes, which are alternately stacked on a top surface of the first substrate in a vertical direction, the pattern structures having an edge region having a step shape in which a length gradually increases from a bottom to a top, and extending in a first direction that is parallel to the top surface of the first substrate;

a base pattern disposed on the pattern structure;

an upper insulating layer on the base pattern;

a channel structure disposed inside a channel hole formed through the pattern structure, and extending to the base pattern;

a cell contact plug disposed inside a cell contact hole formed through a step-shaped region of the pattern structure, extending to the upper insulating layer, and electrically connected to one gate electrode in the pattern structure;

a through-plug disposed inside a through-hole formed through an outer side of the base pattern to extend to the upper insulating layer; and a plate contact plug disposed inside a plate contact hole formed through an outer side of the pattern structure, and electrically connected to the base pattern, wherein bottom surfaces of the cell contact plug, the through-plug, and the plate contact plug are disposed on a same plane.

15. The vertical semiconductor device of claim 14, further comprising an embedded insulating pattern disposed inside a trench that is disposed between the pattern structures, and extending in the first direction, wherein each of the bottom surfaces of the cell contact plug, the through-plug, and the plate contact plug is disposed at a level higher than a bottom surface of the embedded insulating pattern.

16. The vertical semiconductor device of claim 14, wherein each of the channel hole, the cell contact hole, the through-hole, and the plate contact hole has a sidewall inclination to have a width that gradually widens from a bottom to a top, and wherein a sidewall of each of the channel hole, the cell contact hole, the through-hole, and the plate contact hole has a bent part.

17. The vertical semiconductor device of claim 14, wherein the bent parts of the channel hole, the cell contact hole, the through-hole, and the plate contact hole are disposed on a same plane.

18. The vertical semiconductor device of claim 14, wherein each of the cell contact plug, the through-plug, and the plate contact plug includes a barrier metal pattern and a metal pattern, and wherein the barrier metal pattern is disposed along sidewalls and bottom surfaces of the cell contact hole, the through-hole, and the plate contact hole.

19. A vertical semiconductor device, comprising:

lower circuit patterns disposed on a first substrate;

a bonding layer disposed on the lower circuit patterns;

a wire disposed on the bonding layer;

a cell stack structure disposed on the wire;

a base pattern disposed on the cell stack structure;

an upper insulating layer disposed on the base pattern;

a cell contact plug passing through the cell stack structure and extending to the upper insulating layer; and a through-plug disposed inside a through-hole formed through an outer side of the base pattern to extend to the upper insulating layer, wherein each of the cell contact plug and the through-plug includes a barrier metal pattern and a metal pattern, and wherein the barrier metal pattern is disposed along sidewalls and bottom surfaces of the cell contact hole and the through-hole.

20. The vertical semiconductor device of claim 19, further comprising a plate contact plug disposed inside a plate contact hole formed through an outer side of the pattern structure, and electrically connected to the base pattern.

* * * * *